United States Patent
Shin et al.

(10) Patent No.: US 12,360,675 B2
(45) Date of Patent: Jul. 15, 2025

(54) MEMORY DEVICE

(71) Applicant: Samsung Electronics Co., Ltd., Suwon-si (KR)

(72) Inventors: Seungjun Shin, Suwon-si (KR); Yeongwoo Kang, Suwon-si (KR); DongHyeok Cho, Suwon-si (KR); Younghun Seo, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 106 days.

(21) Appl. No.: 18/333,690

(22) Filed: Jun. 13, 2023

(65) Prior Publication Data

US 2024/0103735 A1    Mar. 28, 2024

(30) Foreign Application Priority Data

Sep. 28, 2022   (KR) .................. 10-2022-0123821

(51) Int. Cl.
   *G06F 3/06*          (2006.01)

(52) U.S. Cl.
   CPC .......... *G06F 3/0614* (2013.01); *G06F 3/0659* (2013.01); *G06F 3/0673* (2013.01)

(58) Field of Classification Search
   CPC .... G06F 3/0614; G06F 3/0659; G06F 3/0673; G11C 2207/005; G11C 7/18; G11C 11/4094; G11C 11/4096; G11C 11/4097
   See application file for complete search history.

(56) References Cited

U.S. PATENT DOCUMENTS

| | | | |
|---|---|---|---|
| 6,442,078 B1* | 8/2002 | Arimoto | G11C 7/18 365/189.08 |
| 7,304,910 B1 | 12/2007 | Hanzawa et al. | |
| 7,916,558 B2 | 3/2011 | Do | |
| 8,750,054 B2 | 6/2014 | Kwack | |
| 9,934,827 B2 | 4/2018 | Wu et al. | |
| 11,031,405 B2 | 6/2021 | Fardad et al. | |
| 2008/0165601 A1* | 7/2008 | Matick | G11C 11/4097 365/207 |
| 2009/0141568 A1* | 6/2009 | Kengeri | G11C 11/4097 365/189.16 |

(Continued)

FOREIGN PATENT DOCUMENTS

| | | |
|---|---|---|
| KR | 100927397 B1 | 11/2009 |
| KR | 20130015939 A | 2/2013 |
| KR | 20220005200 A | 1/2022 |

*Primary Examiner* — Jason W Blust
(74) *Attorney, Agent, or Firm* — Myers Bigel, P.A.

(57) ABSTRACT

Disclosed is a memory device which includes a first memory cell that is electrically connected with a first word line and a first bit line, a first bit line sense amplifier circuit that is electrically connected with the first bit line, a first local sense amplifier circuit that is electrically connected with the first bit line sense amplifier circuit through a first local input/output line, a first local driver that is electrically connected with the first local sense amplifier circuit through a first pre-global input/output line, and a sense amplifier and write driver that is electrically connected with the first local driver through a global input/output line, and the first local driver selectively electrical-disconnects the first pre-global input/output line from the global input/output line, based on an operation for the first memory cell.

20 Claims, 21 Drawing Sheets

(56) References Cited

U.S. PATENT DOCUMENTS

| | | | |
|---|---|---|---|
| 2013/0107650 A1* | 5/2013 | Kajigaya | G11C 7/1048 365/189.011 |
| 2019/0139594 A1* | 5/2019 | Ryu | G11C 11/4097 |
| 2022/0293619 A1 | 9/2022 | Kim et al. | |

* cited by examiner

MEMORY DEVICE

CROSS-REFERENCE TO RELATED APPLICATIONS

This application claims priority under 35 U.S.C. § 119 to Korean Patent Application No. 10-2022-0123821 filed on Sep. 28, 2022, in the Korean Intellectual Property Office, the disclosures of which are incorporated by reference herein in their entireties.

BACKGROUND

Embodiments of the present disclosure described herein relate to a semiconductor device, and more particularly, relate to a memory device.

A semiconductor memory is classified as a volatile memory, in which stored data disappear when a power is turned off, such as a static random access memory (SRAM) or a dynamic random access memory (DRAM), or a non-volatile memory, in which stored data are retained even when a power is turned off, such as a flash memory, a phase-change RAM (PRAM), a magnetic RAM (MRAM), a resistive RAM (RRAM), or a ferroelectric RAM (FRAM).

A DRAM device includes memory cells connected with a word line and a bit line. Through the bit lines, the DRAM device stores data in memory cells or reads data stored in the memory cells. Through global input/output lines, the DRAM device may transfer data to the bit lines or may receive data from the bit lines. In this case, when the RC loading of the global input/output lines increases due to various factors, the performance and reliability of operation of the DRAM device are reduced.

SUMMARY

Embodiments of the present disclosure provide a memory device with improved reliability and improved performance.

According to some embodiments, a memory device includes a first memory cell that is electrically connected with a first word line and a first bit line, a first bit line sense amplifier circuit that is electrically connected with the first bit line, a first local sense amplifier circuit that is electrically connected with the first bit line sense amplifier circuit through a first local input/output line, a first local driver that is electrically connected with the first local sense amplifier circuit through a first pre-global input/output line, and a sense amplifier and write driver that is electrically connected with the first local driver through a global input/output line, and the first local driver selectively electrically disconnects the first pre-global input/output line from the global input/output line, based on an operation for the first memory cell.

According to some embodiments, a memory device includes a first sub-array that includes a first local driver connected with a global input/output line, and a second sub-array that includes a second local driver connected with the global input/output line. When an operation for a first memory cell included in the first sub-array is performed, the second local driver blocks a connection with the global input/output line. When an operation for a second memory cell included in the second sub-array is performed, the first local driver blocks a connection with the global input/output line.

According to some embodiments, a memory device includes a substrate, a transistor layer that is on the substrate and including a first bit line sense amplifier circuit, a first local sense amplifier circuit, and a first local driver, a wiring layer that is on the transistor layer and includes a first local input/output line that electrically connects the first bit line sense amplifier circuit and the first local sense amplifier circuit, and a first pre-global input/output line that electrically connects the first local sense amplifier circuit and the first local driver, a memory cell layer that is on the wiring layer and includes a first memory cell that is electrically connected with the first bit line sense amplifier circuit through a first bit line, and a metal layer that is on the memory cell layer and includes a global input/output line that is electrically connected with the first local driver.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily implements the invention.

Figure 1:
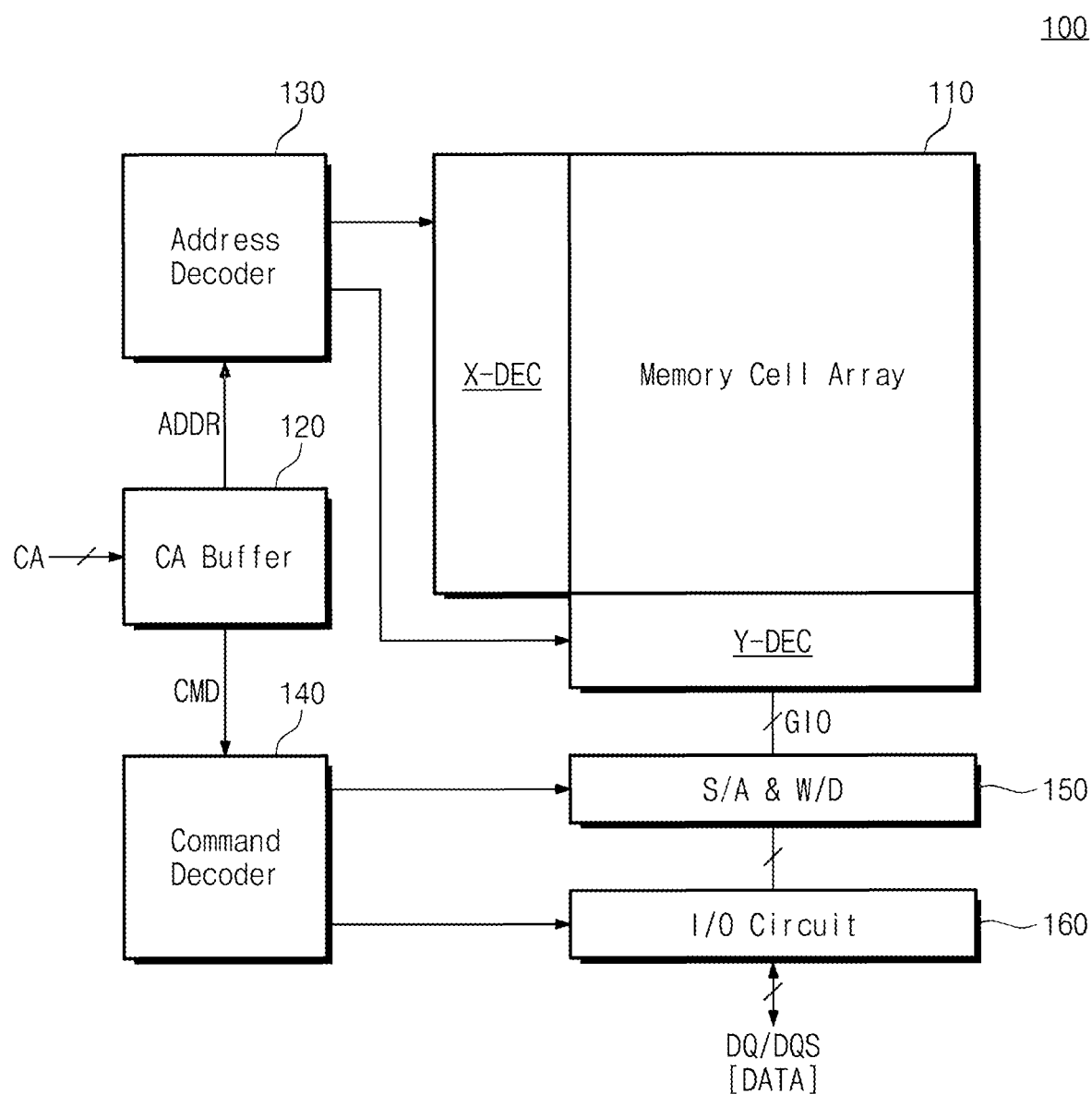
FIG. 1 is a block diagram illustrating a memory device according to some embodiments of the present disclosure.

FIG. 1 is a block diagram illustrating a memory device according to some embodiments of the present disclosure. Referring to FIG. 1, a memory device 100 may include a memory cell array 110, a command/address buffer 120, an address decoder 130, a command decoder 140, a sense amplifier and write driver 150, and an input/output circuit 160.

The memory cell array 110 may include a plurality of memory cells. A plurality of memory cells may be connected with word lines and bit lines. In some embodiments, each of the plurality of memory cells may be a dynamic random access memory (DRAM) cell, but the present disclosure is not limited thereto. For example, each of the plurality of memory cells may be implemented with one of various types of memory cells such as a PRAM cell, an MRAM cell, an RRAM cell, an FRAM, and/or a TRAM cell.

The memory cell array 110 may be connected with a row decoder X-DEC through the word lines and may be connected with a column decoder Y-DEC through the bit lines. The row decoder X-DEC may control the word lines under control of the address decoder 130. The column decoder Y-DEC may control the bit lines under control of the address decoder 130.

The command/address buffer 120 may be configured to receive command/address signals from an external device (e.g., a memory controller or a register clock driver RCD) through command/address lines CA and to temporarily store or buffer the received signals.

The address decoder 130 may be configured to receive an address signal ADDR from the command/address buffer 120 and to decode the received address signal ADDR. The address decoder 130 may be configured to control the row decoder X-DEC and the column decoder Y-DEC based on the decoding result.

The command decoder 140 may receive a command signal CMD from the command/address buffer 120 and may decode the received command signal CMD. The command decoder 140 may control the components of the memory device 100 based on the decoding result. For example, when the command signal CMD received from the command/address buffer 120 corresponds to a write command, the command decoder 140 may control an operation of the sense amplifier and write driver 150 (i.e., may activate the write driver) such that data received through data lines DQ and the input/output circuit 160 are written in the memory cell array 110. In some embodiments, when the command signal CMD received from the command/address buffer 120 is a read command, the command decoder 140 may control an operation of the sense amplifier and write driver 150 (i.e., may activate the sense amplifier) such that data stored in the memory cell array 110 are read out.

Under control of the command decoder 140, the sense amplifier and write driver 150 may read data stored in the memory cell array 110 or may write data in the memory cell array 110. In some embodiments, the sense amplifier and write driver 150 may be connected with the memory cell array 110 through global input/output lines GIO.

Through the data lines DQ, the input/output circuit 160 may receive data from the external device (e.g., a memory controller) or may send data to the external device.

Figure 2:
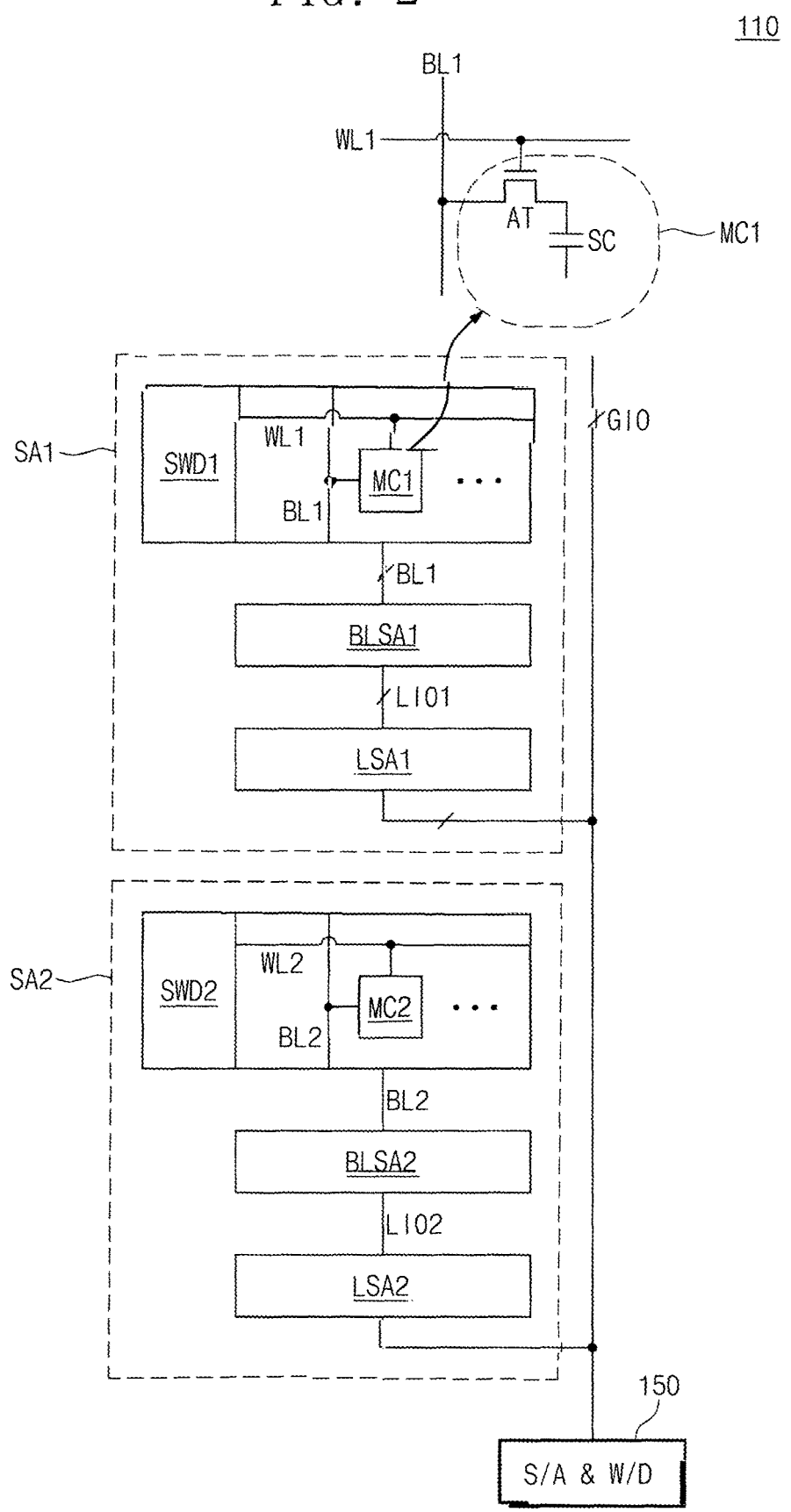
FIG. 2 is a diagram illustrating some components of a memory cell array of FIG. 1.

FIG. 2 is a diagram illustrating some components of a memory cell array of FIG. 1. Referring to FIGS. 1 and 2, the memory cell array 110 may include a first sub-array SA1 and a second sub-array SA2. For convenience of description, some embodiments in which the memory cell array 110 includes the first and second sub-arrays SA1 and SA2 will be described with reference to FIG. 2, but the present disclosure is not limited thereto. For example, the memory cell array 110 may further include additional sub-arrays. In some embodiments, at least some of the plurality of sub-arrays may be disposed to share the same global input/output lines. In some embodiments, at least some of the plurality of sub-arrays may be disposed to share the same word lines. In some embodiments, the plurality of sub-arrays may be disposed along a row direction and a column direction.

The first sub-array SA1 may include first memory cells MC1, a first sub-word line driver SWD1, a first bit line sense amplifier circuit BLSA1, and a first local sense amplifier circuit LSA1.

The first memory cells MC1 may be connected with first word lines WL1 and first bit lines BL1. Each of the first memory cells MC1 may be a DRAM cell. For example, each of the first memory cells MC1 may include an access transistor AT and a storage capacitor SC. The access transistor AT may be connected between the first bit line BL1 and the storage capacitor SC and may operate in response to a voltage level of the first word line WL1.

The first sub-word line driver SWD1 may be configured to control the first word lines WL1 connected with the first memory cells MC1. For example, under control of the address decoder 130 (or the row decoder X-DEC), the first sub-word line driver SWD1 may control the first word lines WL1 connected with the first memory cells MC1.

The first bit line sense amplifier circuit BLSA1 may be connected with the first memory cells MC1 through the first bit lines BL1. The first bit line sense amplifier circuit BLSA1 may sense and amplify voltage changes of the first bit lines BL1. The amplified voltage changes may be output through first local input/output lines LIO1. In some embodiments, the first bit line sense amplifier circuit BLSA1 may control voltages of the first bit lines BL1 based on voltages of the first local input/output lines LIO1.

The first local sense amplifier circuit LSA1 may be connected with the first bit line sense amplifier circuit BLSA1 through the first local input/output lines LIO1. The first local sense amplifier circuit LSA1 may output signals received through the first local input/output lines LIO1 to the global input/output lines GIO. In some embodiments, the first local sense amplifier circuit LSA1 may output signals received through the global input/output lines GIO to the first local input/output lines LIO1.

The second sub-array SA2 may include second memory cells MC2, a second sub-word line driver SWD2, a second bit line sense amplifier circuit BLSA2, and a second local sense amplifier circuit LSA2. The second memory cells MC2 may be connected with second word lines WL2 and second bit lines BL2. The second bit line sense amplifier circuit BLSA2 may be connected with the second memory cells MC2 through the second bit lines BL2. The second local sense amplifier circuit LSA2 may be connected with the second bit line sense amplifier circuit BLSA2 through the second local input/output lines LIO2. The second local sense amplifier circuit LSA2 may be connected with the global input/output lines GIO. Operations of the components of the second sub-array SA2 are similar to those of the components of the first sub-array SA1 described above, and thus, additional description will be omitted to avoid redundancy.

The global input/output lines GIO may be connected with the sense amplifier and write driver 150. For example, the sense amplifier and write driver 150 may control the global input/output lines GIO based on write data received from the external device (e.g., a memory controller). In some embodiments, the sense amplifier and write driver 150 may sense and amplify voltage changes of the global input/output lines GIO.

Figure 3:
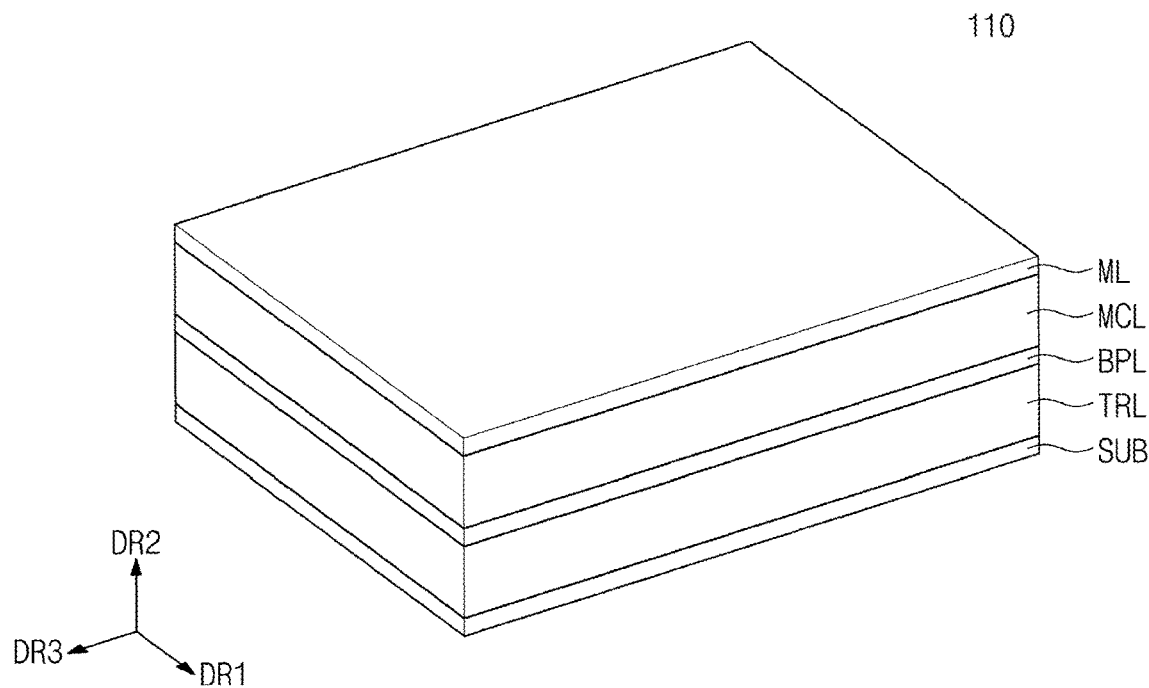
FIG. 3 is a perspective view illustrating a stacked structure of a memory cell array of FIG. 2.

FIG. 3 is a perspective view illustrating a stacked structure of a memory cell array of FIG. 2. In some embodiments, the memory cell array 110 of FIG. 2 may have a stacked structure. For example, as illustrated in FIG. 3, the memory cell array 110 may include a substrate SUB, a transistor layer TRL, a wiring layer BPL, a memory cell layer MCL, and a metal layer ML.

The substrate SUB may be provided. The transistor layer TRL may be formed on the substrate SUB. The transistor layer TRL may include various elements (e.g., transistors) for implementing the first and second sub-word line drivers SWD1 and SWD2, the first and second bit line sense amplifier circuits BLSA1 and BLSA2, and the first and second local sense amplifier circuits LSA1 and LSA2 described with reference to FIG. 2.

The wiring layer BPL may be formed on the transistor layer TRL. The wiring layer BPL may include a plurality of wires for electrically connecting the elements included in the transistor layer TRL. In some embodiments, the plurality of wires included in the wiring layer BPL may include doped polysilicon, metal, conductive metal nitride, conductive metal silicide, conductive metal oxide, or a combination thereof. For example, the plurality of wires may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto. The plurality of wires may include a single layer or multiple layers of the above materials. In some embodiments, the plurality of wires may include a two-dimensional semiconductor material, and for example, the two-dimensional semiconductor material may include graphene, carbon nanotube, or a combination thereof. In some embodiments, the plurality of wires included in the wiring layer BPL may include the first local input/output lines LIO1 and the second local input/output lines LIO2. In other words, the first local input/output lines LIO1 and the second local input/output lines LIO2 may be formed through the plurality of wires of the wiring layer BPL.

The memory cell layer MCL may be formed on the wiring layer BPL. The memory cell layer MCL may include the first memory cells MC1 and the second memory cells MC2 as illustrated in FIG. 2. For example, the access transistors AT and the storage capacitors SC included in the plurality of memory cells (e.g., MC1 and MC2) may be formed in the memory cell layer MCL. In some embodiments, the access transistors AT included in the plurality of memory cells (e.g., MC1 and MC2) may be formed in the transistor layer TRL, and the storage capacitors SC included in the plurality of memory cells (e.g., MC1 and MC2) may be formed in the memory cell layer MCL.

The metal layer ML may be formed on the memory cell layer MCL. The metal layer ML may include various metal wires connected with the memory cell array 110. In some embodiments, various metal wires included in the metal layer ML may include the global input/output lines GIO.

As described above, the memory cell array 110 of the memory device 100 according to some embodiments of the present disclosure may have a cell on peripheral (CoP) structure in which memory cells (e.g., MC1 and MC2) are formed on a peripheral circuit (e.g., the first and second bit line sense amplifier circuits BLSA1 and BLSA2 and the first and second local sense amplifier circuits LSA1 and LSA2).

Figure 4:
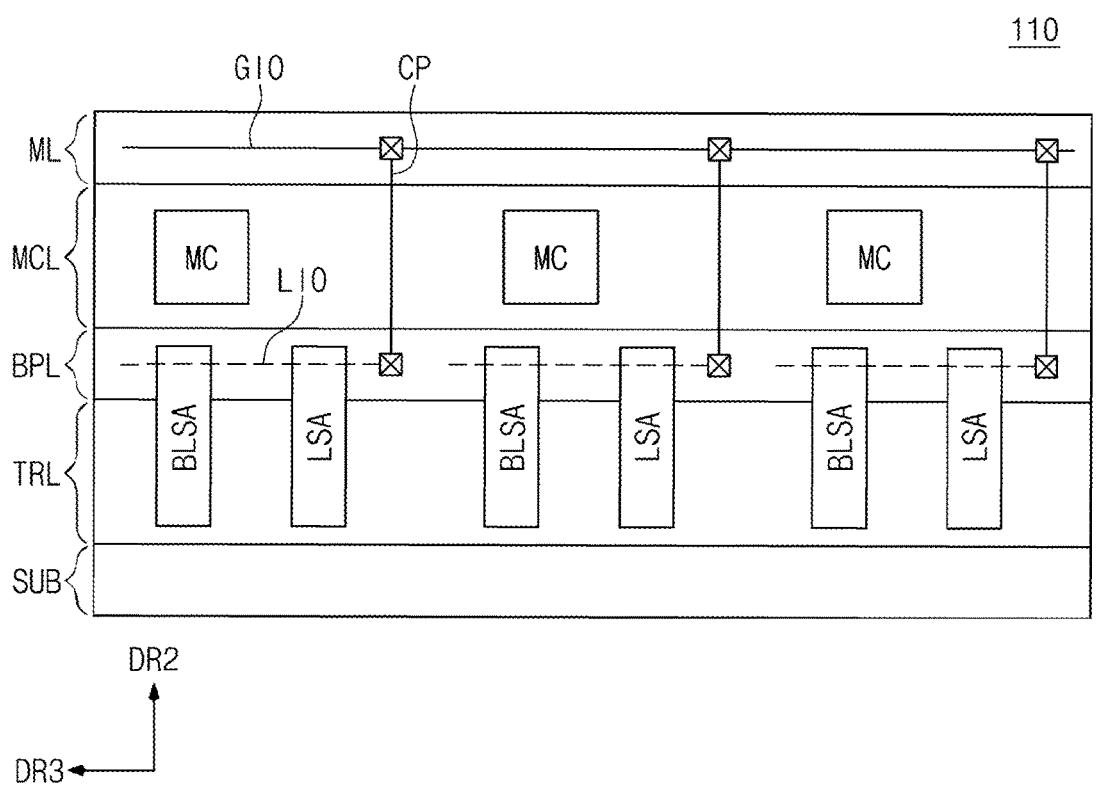
FIG. 4 is a vertical cross-sectional view of a memory cell array of FIG. 3.

FIG. 4 is a vertical cross-sectional view of a memory cell array of FIG. 3. The stacked structure (i.e., the substrate SUB, the transistor layer TRL, the wiring layer BPL, the memory cell layer MCL, and the metal layer ML of FIG. 3) of the memory cell array 110 is described above, and thus, additional description will be omitted to avoid redundancy.

Referring to FIGS. 3 and 4, the bit line sense amplifier circuit BLSA and the local sense amplifier circuit LSA may be formed in the transistor layer TRL, and the memory cells MC may be formed in the memory cell layer MCL. The bit line sense amplifier circuit BLSA and the local sense amplifier circuit LSA may be connected with each other through the local input/output lines LIO formed in the wiring layer BPL. The local sense amplifier circuit LSA may be connected with the global input/output lines GIO included in the metal layer ML through contact plugs CP. In some embodiments, the contact plugs CP may be formed to vertically penetrate the memory cell layer MCL.

In some embodiments, the local input/output line LIO included in the wiring layer BPL may have a greater resistance than the global input/output line GIO included in the metal layer ML. That is, the total RC loading of the global input/output line GIO may increase due to the local input/output line LIO electrically connected with the global input/output line GIO. The increase of the RC loading of the global input/output line GIO may make it difficult to sufficiently secure the margin for a voltage change (or a signal transfer) of the global input/output line GIO. This may mean that the performance and reliability of the memory device 100 are reduced.

Figure 5:
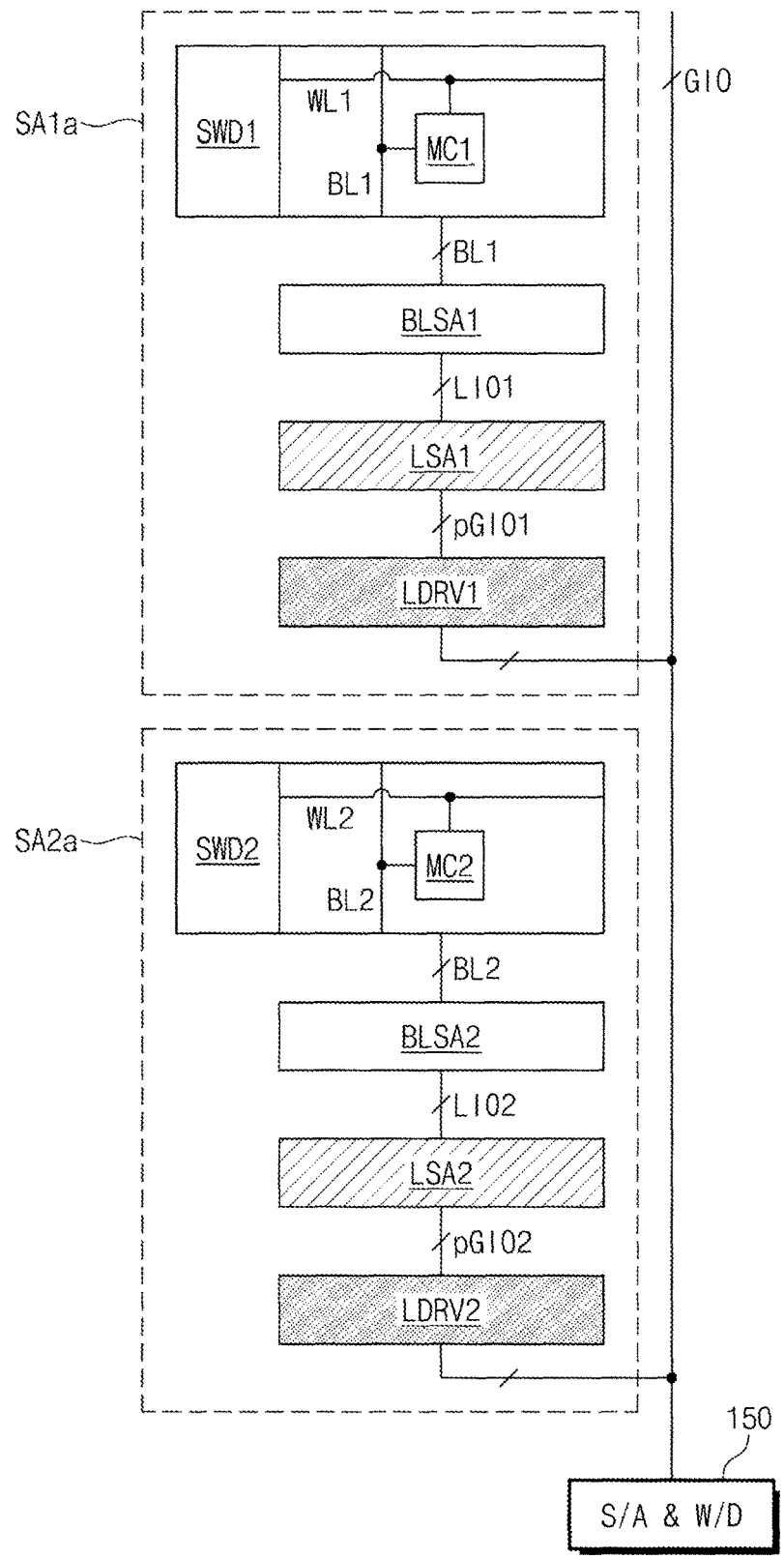
FIG. 5 is a diagram illustrating a memory cell array of FIG. 1.

FIG. 5 is a diagram illustrating a memory cell array of FIG. 1. In some embodiments, a memory cell array 110a of FIG. 5 may have the stacked structure or the CoP structure as described with reference to FIG. 3. For convenience of description, additional description associated with the components described above will be omitted to avoid redundancy.

Referring to FIGS. 1 and 5, the memory cell array 110a may include a first sub-array SA1a and a second sub-array SA2a. In some embodiments, the memory cell array 110a may further include a plurality of sub-arrays. The plurality of sub-arrays may be arranged along the row direction and the column direction. Some of the plurality of sub-arrays may share word lines, and some of the plurality of sub-arrays may share the global input/output lines GIO.

The first sub-array SA1a may include the first memory cells MC1, the first sub-word line driver SWD1, the first bit line sense amplifier circuit BLSA1, the first local sense amplifier circuit LSA1, and a first local driver LDRV1. Operations of the first memory cells MC1, the first sub-word line driver SWD1, the first bit line sense amplifier circuit BLSA1, and the first local sense amplifier circuit LSA1 are similar to those described above, and thus, additional description will be omitted to avoid redundancy. The first local driver LDRV1 may be connected with the first local sense amplifier circuit LSA1 through a pre-global input/output line pGIO. The first local driver LDRV1 may be connected with the global input/output line GIO. In some embodiments, the pre-global input/output line pGIO may be implemented through a plurality of wires included in the wiring layer BPL, which will be described later.

Depending on operations of the memory device 100, the first local driver LDRV1 may electrically connect the pre-global input/output line pGIO and the global input/output line GIO, may control/drive the global input/output line GIO based on a level of the pre-global input/output line pGIO, or may electrically disconnect or electrically isolate the pre-global input/output line pGIO from the global input/output line GIO.

For example, when a memory cell targeted for the read operation of the memory device 100 is included in the first memory cells MC1, the first local driver LDRV1 may control or drive the global input/output line GIO based on a level of the pre-global input/output line pGIO. When a memory cell targeted for the write operation of the memory device 100 is included in the first memory cells MC1, the first local driver LDRV1 may electrically connect the global input/output line GIO and the pre-global input/output line pGIO.

When a memory cell targeted for the read operation or the write operation of the memory device 100 is not included in the first memory cells MC1 (i.e., when an operation is not performed on the first memory cells MC1), the first local driver LDRV1 may electrically disconnect or electrically isolate the pre-global input/output line pGIO from the global input/output line GIO. According to the above description, because the remaining pre-global input/output lines pGIO other than the pre-global input/output line pGIO corresponding to the memory cell targeted for the read/write operation are not electrically connected with the global input/output line GIO, the total RC loading of the global input/output line GIO decreases.

The second sub-array SA2a may include the second memory cells MC2, the second sub-word line driver SWD2, the second bit line sense amplifier circuit BLSA2, the second local sense amplifier circuit LSA2, and a second local driver LDRV2. Components and operations of the second sub-array SA2a are similar to the components and operations of the first sub-array SA1a described above, and thus, additional description will be omitted to avoid redundancy.

Figure 6:
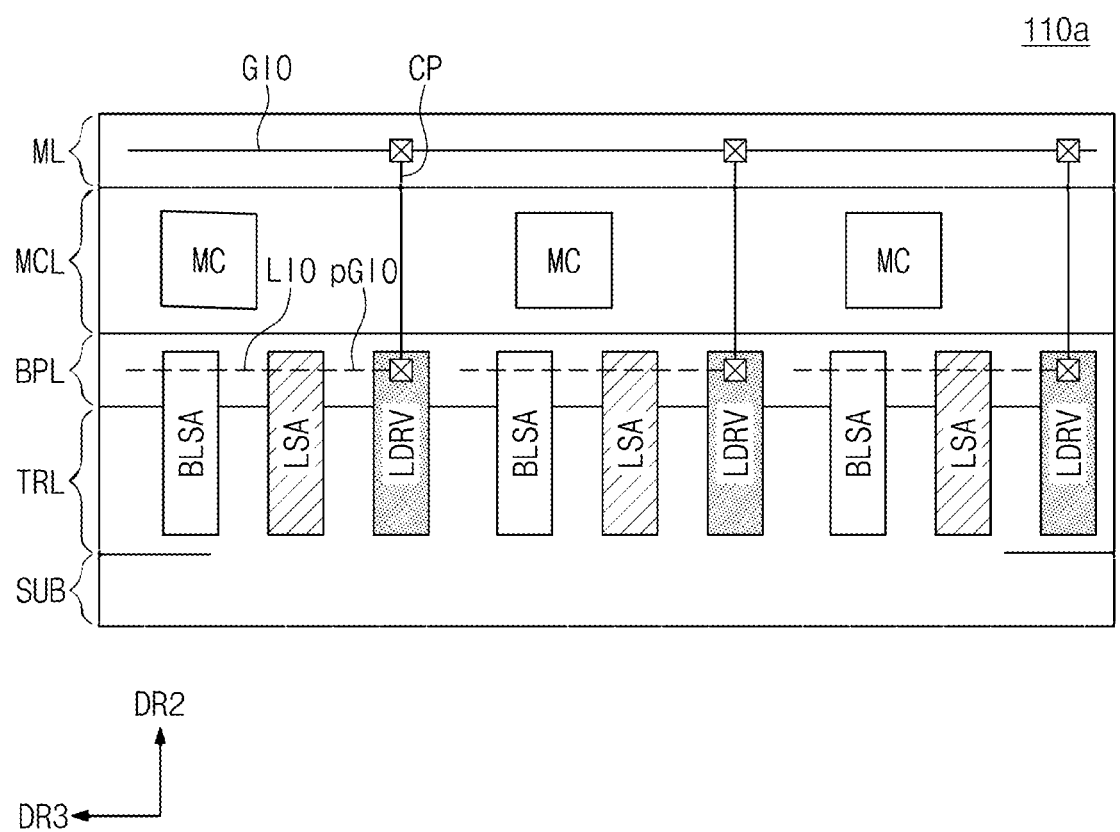
FIG. 6 is a vertical cross-sectional view of a memory cell array of FIG. 5.

FIG. 6 is a vertical cross-sectional view of a memory cell array of FIG. 5. In some embodiments, the memory cell array 110a of FIG. 5 may be formed in the stacked structure or the CoP structure as described with reference to FIG. 3. Referring to FIGS. 3, 5, and 6, the memory cell array 110a may include the substrate SUB, the transistor layer TRL, the wiring layer BPL, the memory cell layer MCL, and the metal layer ML.

The bit line sense amplifier circuits BLSA, the local sense amplifier circuits LSA, and the local drivers LDRV may be formed in the transistor layer TRL. The memory cells MC may be formed in the memory cell layer MCL.

In some embodiments, the bit line sense amplifier circuits BLSA, the local sense amplifier circuits LSA, and the local drivers LDRV may be electrically connected with each other through a plurality of wires formed in the wiring layer BPL. For example, the bit line sense amplifier circuit BLSA may be connected with the local sense amplifier circuit LSA through the local input/output line LIO included in the wiring layer BPL. The local sense amplifier circuit LSA may be connected with the local driver LDRV through the pre-global input/output line pGIO included in the wiring layer BPL. The local drivers LDRV may be connected with the global input/output lines GIO included in the metal layer ML through the contact plugs CP.

As described above, the local drivers LDRV may be located between the global input/output lines GIO included in the metal layer ML and the pre-global input/output lines pGIO included in the wiring layer BPL, depending on operations of the memory device 100, the local drivers LDRV may selectively drive the global input/output lines GIO and the pre-global input/output lines pGIO or may selectively connect/disconnect or electrically isolate the global input/output lines GIO with/from the pre-global input/output lines pGIO.

Figure 7:
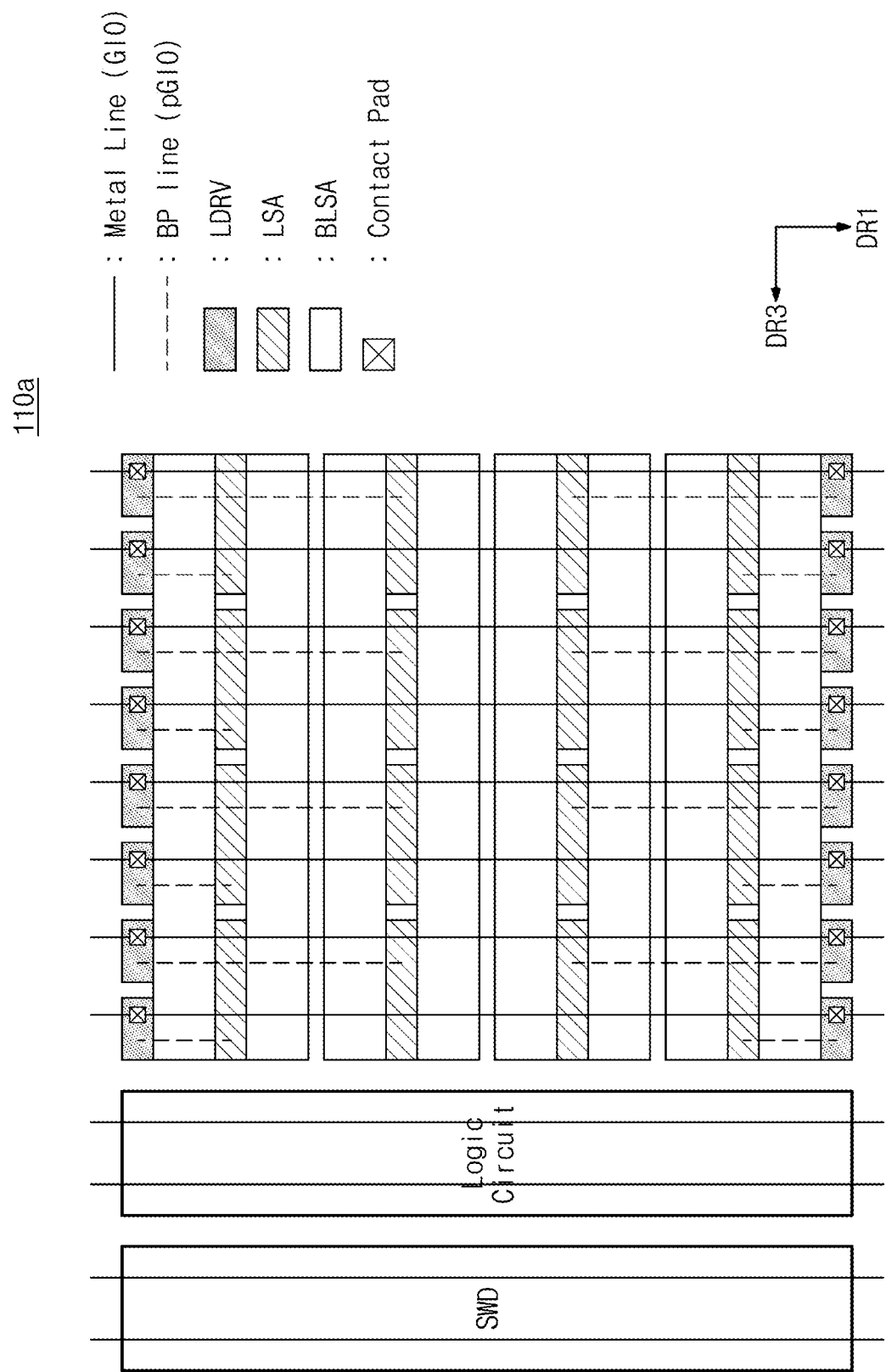
FIG. 7 illustrates a plan view of a memory cell array of FIG. 5.

FIG. 7 illustrates a plan view of a memory cell array of FIG. 5. In some embodiments, FIG. 7 shows a plan view of the transistor layer TRL, in the memory cell array 110a of the stacked structure or the CoP structure. In some embodiments, FIG. 7 shows a plan view of the transistor layer TRL corresponding to one of a plurality of sub-arrays included in the memory cell array 110a.

Referring to FIGS. 3, 5, and 7, the transistor layer TRL of the memory cell array 110a may include the sub-word line driver SWD, a logic circuit, the bit line sense amplifier circuit BLSA, the local sense amplifier circuit LSA, and the local driver LDRV.

As illustrated in FIG. 7, the bit line sense amplifier circuit BLSA, the local sense amplifier circuit LSA, and the local driver LDRV may be formed in the transistor layer TRL. The bit line sense amplifier circuit BLSA, the local sense amplifier circuit LSA, and the local driver LDRV may be electrically connected with each other through a plurality of wires (BP lines) included in the wiring layer BPL. The local driver LDRV may be electrically connected with a plurality of metal lines (e.g., the global input/output lines GIO) included in the metal layer ML through contact pads.

A partial plan view or layout for the sub-word line driver SWD, the logic circuit, the bit line sense amplifier circuit BLSA, the local sense amplifier circuit LSA, and the local driver LDRV is illustrated as an example, but the present disclosure is not limited thereto.

Figure 8:
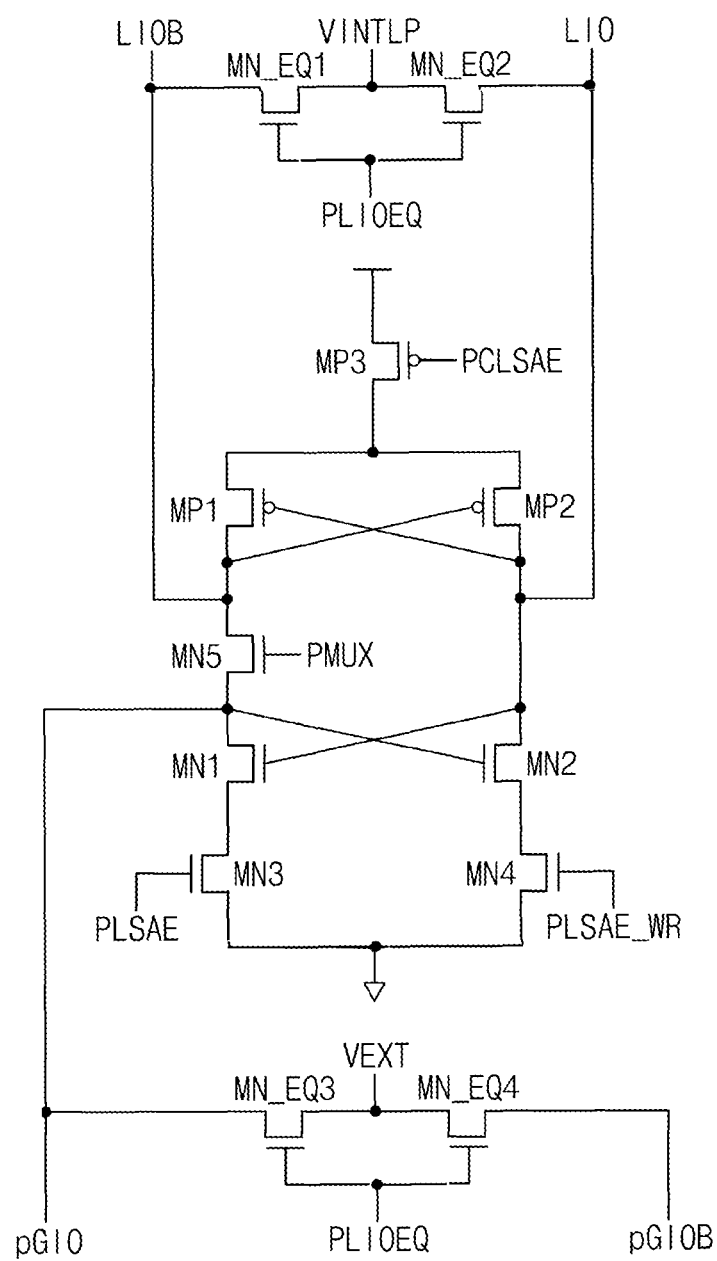
FIG. 8 is a circuit diagram illustrating a first local sense amplifier circuits of FIG. 5.
Figure 9:
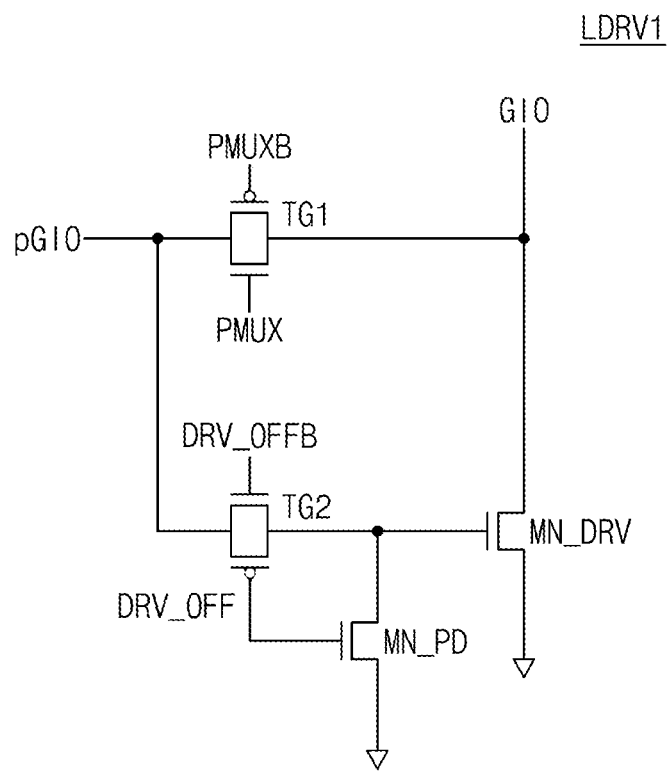
FIG. 9 is a circuit diagram illustrating a first local driver of FIG. 5.

FIG. 8 is a circuit diagram illustrating a first local sense amplifier circuits of FIG. 5. FIG. 9 is a circuit diagram illustrating a first local driver of FIG. 5. For convenience of description, one local sense amplifier circuit and one local driver will be described, but the present disclosure is not limited thereto. For example, one sub-array may include a plurality of local sense amplifier circuits and a plurality of local drivers, a structure and an operation of each of the plurality of local sense amplifier circuits may be similar to those of a first local sense amplifier circuit described with reference to FIG. 8, and a structure and an operation of each of the plurality of local drivers may be similar to those of a first local driver described with reference to FIG. 9. In some embodiments, a structure and an operation of each of a plurality of local sense amplifier circuits included in each of a plurality of sub-arrays may be similar to those of a first local sense amplifier circuit described with reference to FIG. 8, and a structure and an operation of each of a plurality of local drivers included in each of the plurality of sub-arrays may be similar to those of a first local driver described with reference to FIG. 9. Various control signals that are provided to the plurality of local sense amplifier circuits and the plurality of local drivers may vary depending on operations of the memory device 100.

In some embodiments, the pre-global input/output line pGIO and the global input/output line GIO that are controlled by the first local sense amplifier circuit LSA1 and the first local driver LDRV1 to be described with reference to FIGS. 8 and 9 may be illustrated in the form of a single line. However, the present disclosure is not limited thereto.

Referring to FIGS. 5, 8, and 9, the first local sense amplifier circuit LSA1 may control the pre-global input/output line pGIO based on local input/output lines LIO and LIOB or may control the local input/output lines LIO and LIOB based on the pre-global input/output line pGIO.

For example, the first local sense amplifier circuit LSA1 may include a plurality of transistors MN1 to MN5, MP1 to MP3, and MN_EQ1 to MN_EQ4. The first and second equalization transistors MN_EQ1 and MN_EQ2 may be connected in series between the local input/output line LIO and the complementary local input/output line LIOB and may operate in response to an equalization signal PLIOEQ. A first equalization voltage VINTLP may be provided to a node between the first and second equalization transistors MN_EQ1 and MN_EQ2. In some embodiments, when the equalization signal PLIOEQ is activated (e.g., when the equalization signal PLIOEQ is at logic high), the first and second equalization transistors MN_EQ1 and MN_EQ2 may be turned on, and thus, the local input/output line LIO and the complementary local input/output line LIOB may be charged with or be transitioned to the first equalization voltage VINTLP. In some embodiments, each of the first and second equalization transistors MN_EQ1 and MN_EQ2 may be an NMOS transistor, but the present disclosure is not limited thereto.

The third and fourth equalization transistors MN_EQ3 and MN_EQ4 may be connected in series between the pre-global input/output line pGIO and a complementary pre-global input/output line pGIOB and may operate in response to the equalization signal PLIOEQ. A second equalization voltage VEXT may be provided to a node between the third and fourth equalization transistors MN_EQ3 and MN_EQ4. In some embodiments, when the equalization signal PLIOEQ is activated (e.g., when the equalization signal PLIOEQ is at logic high), the third and fourth equalization transistors MN_EQ3 and MN_EQ4 may be turned on, and thus, the pre-global input/output line pGIO and the complementary pre-global input/output line pGIOB may be charged with or be transitioned to the second equalization voltage VEXT. In some embodiments, each of the third and fourth equalization transistors MN_EQ3 and MN_EQ4 may be an NMOS transistor, but the present disclosure is not limited thereto.

The first and second PMOS transistors MP1 and MP2 may be connected in series between the complementary local input/output line LIOB and the local input/output line LIO. A gate of the first PMOS transistor MP1 may be connected with the local input/output line LIO, and a gate of the second PMOS transistor MP2 may be connected with the complementary local input/output line LIOB.

The third PMOS transistor MP3 may be connected between a node between the first and second PMOS transistors MP1 and MP2 and a power supply voltage and may operate in response to a first activation signal PCLSAE.

The first and third NMOS transistors MN1 and MN3 may be connected in series between the pre-global input/output line pGIO and a ground voltage. The second and fourth NMOS transistors MN2 and MN4 may be connected in series between the local input/output line LIO and the ground voltage. A gate of the first NMOS transistor MN1 may be connected with the local input/output line LIO. A gate of the second NMOS transistor MN2 may be connected with the pre-global input/output line pGIO. A gate of the third NMOS transistor MN3 may be connected with a second activation signal PLSAE. A gate of the fourth NMOS transistor MN4 may be connected with a third activation signal PLSAE_WR. The fifth NMOS transistor MN5 may be connected between the complementary local input/output line LIOB and the pre-global input/output line pGIO and may operate in response to a MUX signal PMUX.

Next, as illustrated in FIG. 9, the first local driver LDRV1 may include first and second transmission gates TG1 and TG2, a pull-down transistor MN_PD, and a driving transistor MN_DRV.

The first transmission gate TG1 may be connected between the global input/output line GIO and the pre-global input/output line pGIO. The first transmission gate TG1 may operate in response to MUX signals PMUX and PMUXB. For example, when the MUX signals PMUX and PMUXB are activated (i.e., when PMUX is at logic high and PMUXB is at logic low), the first transmission gate TG1 may be turned on, or when the MUX signals PMUX and PMUXB are deactivated (i.e., when PMUX is at logic low and PMUXB is at logic high), the first transmission gate TG1 may be turned off.

The driving transistor MN_DRV may be connected between the global input/output line GIO and the ground voltage. The pull-down transistor MN_PD may be connected between a gate of the driving transistor MN_DRV and the ground voltage. A gate of the pull-down transistor MN_PD may be connected with a driving-off signal DRV_OFF.

The second transmission gate TG2 may be connected between the gate of the driving transistor MN_DRV and the pre-global input/output line pGIO. The second transmission gate TG2 may operate in response to driving-off signals DRV_OFF and DRV_OFFB. For example, when the driving-off signals DRV_OFF and DRV_OFFB are activated (e.g., DRV_OFF is at logic high and DRV_OFFB is at logic low), the second transmission gate TG2 may be turned off. When the driving-off signals DRV_OFF and DRV_OFFB are deactivated (e.g., DRV_OFF is at logic low and DRV_OFFB is at logic high), the second transmission gate TG2 may be turned on.

In some embodiments, when the write operation is performed on the first memory cell MC1 corresponding to the pre-global input/output line pGIO, the first local driver LDRV1 may operate as a switch that electrically connects the global input/output line GIO and the pre-global input/output line pGIO. When the read operation is performed on the first memory cell MC1 corresponding to the pre-global input/output line pGIO, the first local driver LDRV1 may operate as a driver that controls the global input/output line GIO based on a level of the pre-global input/output line pGIO.

Figure 10:
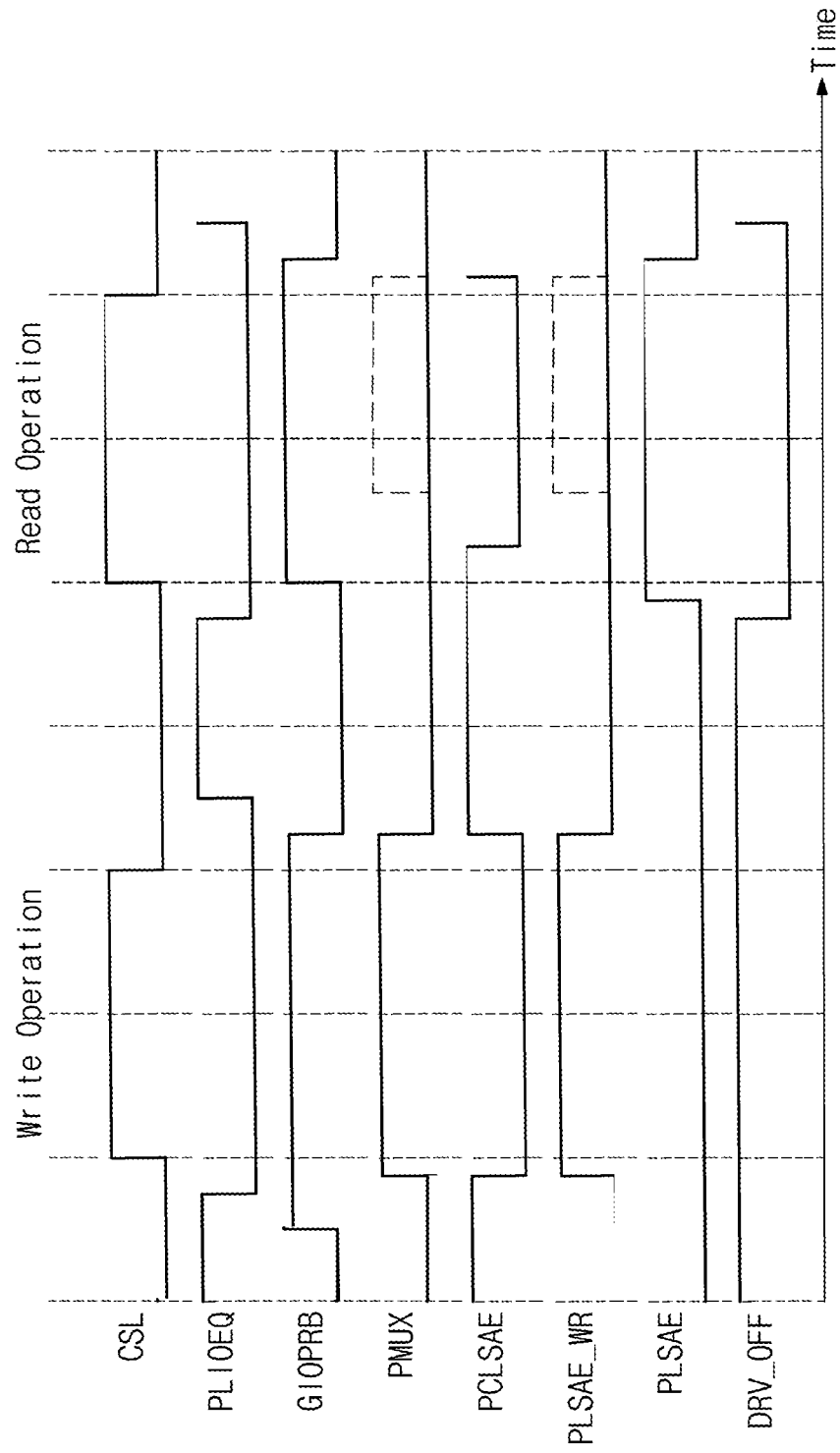
FIG. 10 is a timing diagram for describing an operation of a first local sense amplifier circuit of FIG. 8 and an operation of a first local driver of FIG. 9.

FIG. 10 is a timing diagram for describing an operation of a first local sense amplifier circuit of FIG. 8 and an operation of a first local driver of FIG. 9. In some embodiments, various control signals illustrated in FIG. 10 may be generated by the command decoder 140 of the memory device 100 of FIG. 1 or by a separate control logic circuit. In some embodiments, as illustrated in FIG. 10, some of activation/deactivation times of control signals may be different. However, for convenience of description, each control signal will be described based on an operation unit (e.g., a write operation or a read operation).

Referring to FIGS. 1, 5, 8, 9, and 10, during the write operation of the first memory cell MC1, a column selection signal CSL may be at logic high, the equalization signal PLIOEQ may be at logic low, a global input/output line precharge signal GIOPRB may be at logic high, the MUX signal PMUX may be at logic high, the first activation signal PCLSAE may be at logic low, the second activation signal PLSAE may be at logic low, the third activation signal PLSAE_WR may be at logic high, and the driving-off signal DRV_OFF may be at logic high.

In the write operation illustrated in FIG. 10, depending on a level of each control signal, the first local driver LDRV1 may electrically connect the global input/output line GIO and the pre-global input/output line pGIO. For example, in response to that the MUX signal PMUX is at logic high, the first transmission gate TG1 of the first local driver LDRV1 may be turned on. In response to the driving-off signal DRV_OFF being at logic high, the second transmission gate TG2 of the first local driver LDRV1 is turned off, and the pull-down transistor MN_PD of the first local driver LDRV1 is turned on. In this case, the ground voltage is applied to the gate of the driving transistor MN_DRV. As such, the global input/output line GIO and the pre-global input/output line pGIO may be electrically connected through the first transmission gate TG1.

In the write operation illustrated in FIG. 10, depending on a level of each control signal, the first local sense amplifier circuit LSA1 may be configured to operate as a latch that temporarily stores the level of the pre-global input/output line pGIO. The level of the pre-global input/output line pGIO temporarily stored by the first local sense amplifier circuit LSA1 may be transferred to the local input/output lines LIO and LIOB.

In some embodiments, the first bit line sense amplifier circuit BLSA1 may control corresponding bit lines based on levels of the local input/output lines LIO and LIOB, and thus, the write operation may be performed on the first memory cell MC1.

During the read operation of the first memory cell MC1, the column selection signal CSL may be at logic high, the equalization signal PLIOEQ may be at logic low, the global input/output line precharge signal GIOPRB may be at logic high, the MUX signal PMUX may be at logic low, the first activation signal PCLSAE may be at logic low, the second activation signal PLSAE may be at logic high, the third activation signal PLSAE_WR may be at logic low, and the driving-off signal DRV_OFF may be at logic low.

In the read operation illustrated in FIG. 10, depending on a level of each control signal, the first local sense amplifier circuit LSA1 may operate as a sense amplifier circuit that controls the pre-global input/output line pGIO based on levels of the local input/output lines LIO and LIOB.

In the read operation illustrated in FIG. 10, depending on a level of each control signal, the first local driver LDRV1 may operate as a driver that controls the global input/output line GIO based on the level of the pre-global input/output line pGIO. In some embodiments, during a partial period of the read operation, even though the MUX signal PMUX and the third activation signal PLSAE_WR are at logic high, the first local sense amplifier circuit LSA1 and the first local driver LDRV1 may operate identically or similarly.

In some embodiments, when the read operation or the write operation is not performed on the first memory cell MC1, the MUX signal PMUX may be at logic low, and the driving-off signal DRV_OFF may be at logic high. In this case, because all the first and second transmission gates TG1 and TG2 of the first local driver LDRV1 are turned off, the pre-global input/output line pGIO and the global input/output line GIO may be electrically disconnected or separated from each other.

Figure 11:
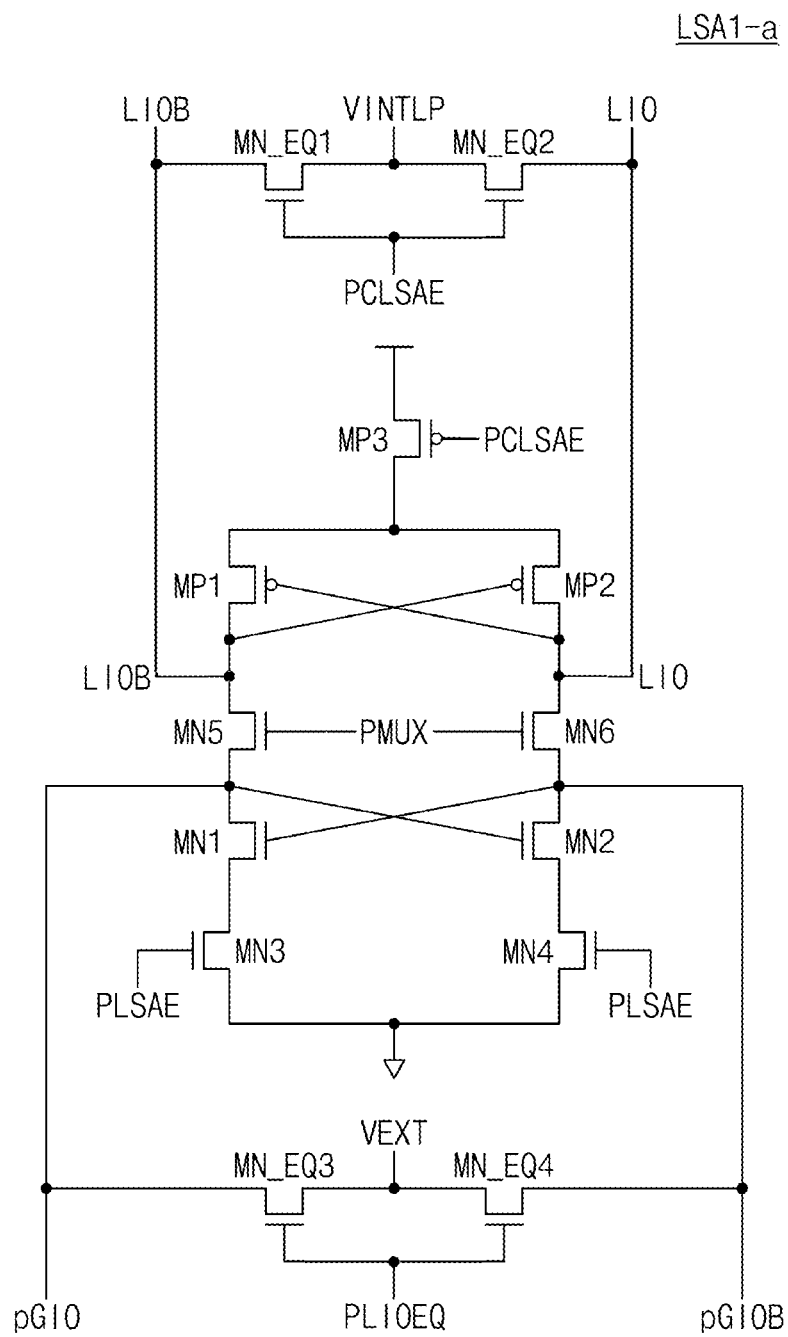
FIG. 11 is a circuit diagram illustrating a first local sense amplifier circuits of FIG. 5.
Figure 12:
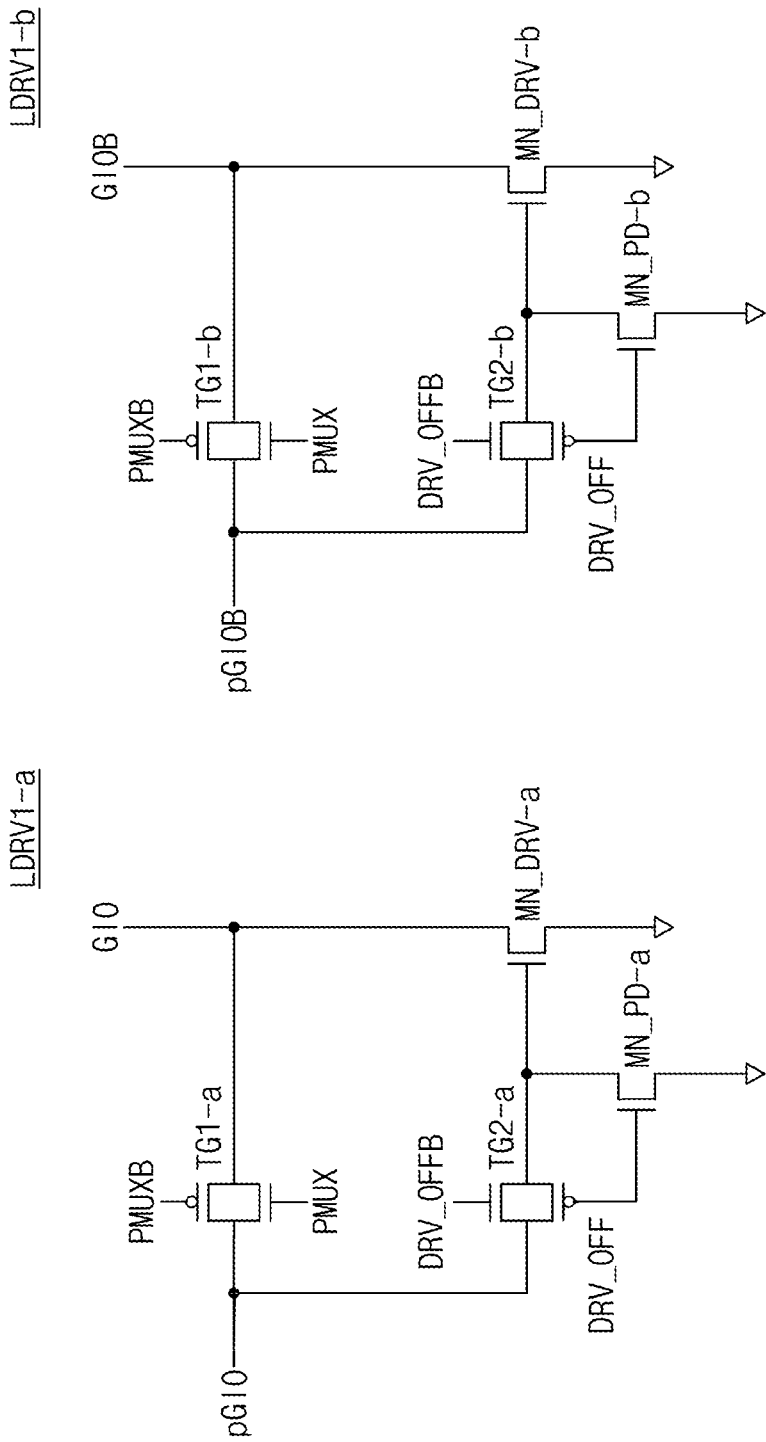
FIG. 12 is a circuit diagram illustrating a first local driver of FIG. 5.

FIG. 11 is a circuit diagram illustrating a first local sense amplifier circuit of FIG. 5. FIG. 12 is a circuit diagram illustrating a first local driver of FIG. 5. In some embodiments, the pre-global input/output line pGIO and the global input/output line GIO that are controlled by the first local sense amplifier circuit LSA1 and the first local driver LDRV1 described with reference to FIGS. 8 and 9 may be implemented in the form of a pair. However, the present disclosure is not limited thereto.

Referring to FIGS. 5, 11, and 12, a first local sense amplifier circuit LSA1-*a* may control the pre-global input/output lines pGIO and pGIOB based on the local input/output lines LIO and LIOB or may control the local input/output lines LIO and LIOB based on the pre-global input/output lines pGIO and pGIOB.

For example, the first local sense amplifier circuit LSAT-a may include a plurality transistors MN1 to MN6, MP1 to MP3, and MN_EQ1 to MN_EQ4. The first to fourth equalization transistors MN_EQ1 to MN_EQ4 are similar to those described with reference to FIG. 8, and thus, additional description will be omitted to avoid redundancy. The first to third PMOS transistors MP1, MP2, and MP3 are similar to those described with reference to FIG. 8, and thus, additional description will be omitted to avoid redundancy.

The first, third, and fifth NMOS transistors MN1, MN3, and MN5 are similar to those described with reference to FIG. 8, and thus, additional description will be omitted to avoid redundancy. In some embodiments, the gate of the first NMOS transistor MN1 may be connected with the complementary pre-global input/output line pGIOB.

The second and fourth NMOS transistors MN2 and MN4 may be connected in series between the complementary pre-global input/output line pGIOB and the ground voltage. The gate of the second NMOS transistor MN2 may be connected with the pre-global input/output line pGIO. The gate of the fourth NMOS transistor MN4 may be connected with the second activation signal PLSAE.

The sixth NMOS transistor MN6 may be connected between the local input/output line LIO and the complementary pre-global input/output line pGIOB and may operate in response to the MUX signal PMUX.

Next, as illustrated in FIG. 12, a first local driver LDRV1-*a* may operate between the pre-global input/output line pGIO and the global input/output line GIO, and a first complementary local driver LDRV1-*b* may operate between the complementary pre-global input/output line pGIOB and a complementary global input/output line GIOB. In some embodiments, each of the first local driver LDRV1-*a* and the first complementary local driver LDRV1-*b* may have a structure similar to the structure of the first local driver LDRV1 described with reference to FIG. 9 except that lines controlled thereby are different.

For example, the first local driver LDRV1-*a* may include first and second transmission gates TG1-*a* and TG2-*a*, a driving transistor MN_DRV-a, and a pull-down transistor MN_PD-a. Components and operations of the first local driver LDRV1-*a* are similar to those described with reference to FIG. 9, and thus, additional description will be omitted to avoid redundancy. The first complementary local driver LDRV1-*b* may include first and second transmission gates TG1-*b* and TG2-*b*, a driving transistor MN_DRV-b, and a pull-down transistor MN_PD-b. Components and operations of the first complementary local driver LDRV1-*b* are similar to those of the first local driver (e.g., LDRV1 or LDRV1-*a*) except that lines controlled thereby are different (i.e., except that the complementary pre-global input/output line pGIOB and the complementary global input/output line GIOB are controlled), and thus, additional description will be omitted to avoid redundancy.

Figure 13:
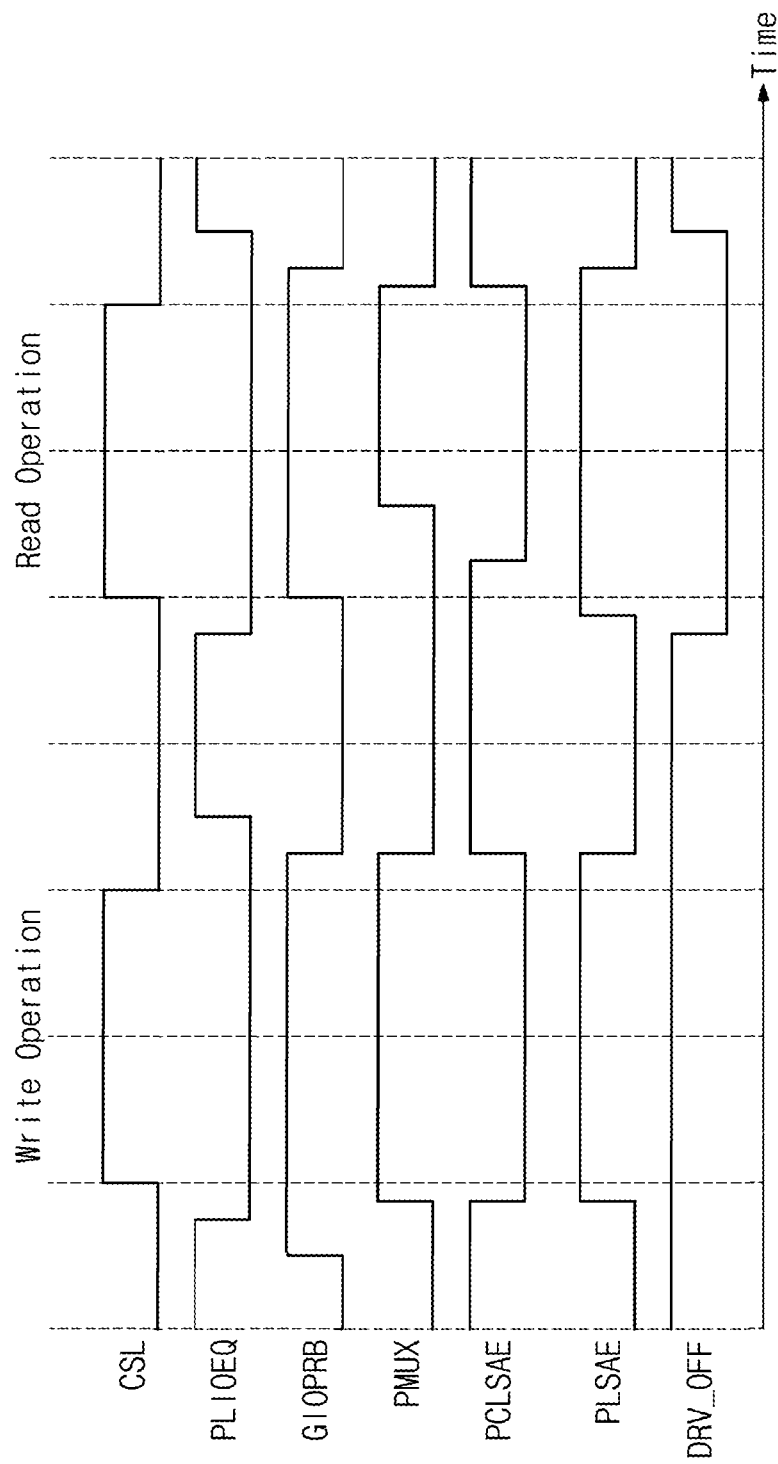
FIG. 13 is a timing diagram for describing an operation of a first local sense amplifier circuit of FIG. 11 and operations of a first local driver and a first complementary local driver of FIG. 12.

FIG. 13 is a timing diagram for describing an operation of a first local sense amplifier circuit of FIG. 11 and operations of a first local driver and a first complementary local driver of FIG. 12. In some embodiments, various control signals illustrated in FIG. 13 may be generated by the command decoder 140 of the memory device 100 of FIG. 1 or by a separate control logic circuit. In some embodiments, as illustrated in FIG. 13, some of activation/deactivation times of control signals may be different. However, for convenience of description, each control signal will be described based on an operation unit (e.g., a write operation or a read operation).

Referring to FIGS. 1, 5, 11, 12, and 13, during the write operation of the first memory cell MC1, the column selection signal CSL may be at logic high, the equalization signal PLIOEQ may be at logic low, the global input/output line precharge signal GIOPRB may be at logic high, the MUX signal PMUX may be at logic high, the first activation signal PCLSAE may be at logic low, the second activation signal PLSAE may be at logic high, and the driving-off signal DRV_OFF may be at logic high.

In the write operation illustrated in FIG. 13, depending on a level of each control signal, the first local driver LDRV1-*a* may electrically connect the global input/output line GIO and the pre-global input/output line pGIO, and the first complementary local driver LDRV1-*b* may electrically connect the complementary global input/output line GIOB and the complementary pre-global input/output line pGIOB. As such, the level of the global input/output line GIO may be transferred to the pre-global input/output line pGIO, and the level of the complementary global input/output line GIOB may be transferred to the complementary pre-global input/output line pGIOB.

For example, in the write operation, depending on the level of each control signal, the first local sense amplifier circuit LSAT-a may operate as a latch that temporarily stores the levels of the pre-global input/output line pGIO and the complementary pre-global input/output line pGIOB. The levels temporarily stored by the first local sense amplifier circuit LSAT-a may be transferred to the local input/output lines LIO and LIOB.

In some embodiments, the first bit line sense amplifier circuit BLSA1 may control corresponding bits lines based on the levels of the local input/output lines LIO and LIOB, and thus, the write operation may be performed on the first memory cell MC1.

During the read operation of the first memory cell MC1, the column selection signal CSL may be at logic high, the equalization signal PLIOEQ may be at logic low, the global input/output line precharge signal GIOPRB may be at logic high, the MUX signal PMUX may be at logic high, the first activation signal PCLSAE may be at logic low, the second activation signal PLSAE may be at logic high, and the driving-off signal DRV_OFF may be at logic low.

In the read operation illustrated in FIG. 13, depending on the level of each control signal, the first local sense amplifier circuit LSA1-*a* may operate as a sense amplifier circuit that controls the pre-global input/output lines pGIO and pGIOB based on the levels of the local input/output lines LIO and LIOB. In the read operation illustrated in FIG. 13, according to the level of each control signal, the first local driver LDRV1-*a* may be configured to drive the global input/output line GIO based on the level of the pre-global input/output line pGIO, and the first complementary local driver LDRV1-*b* may be configured to drive the complementary global input/output line GIOB based on the level of the complementary pre-global input/output line pGIOB.

In some embodiments, when the read operation or the write operation is not performed on the first memory cell MC1, the MUX signal PMUX may be at logic low, and the driving-off signal DRV_OFF may be at logic high. In this case, when all the first and second transmission gates TG1-*a* and TG2-*a* of the first local driver LDRV1-*a* are turned off, the pre-global input/output line pGIO and the global input/output line GIO may be electrically disconnected or separated from each other. When all the first and second transmission gates TG1-*b* and TG2-*b* of the first complementary local driver LDRV1-*b* are turned off, the complementary pre-global input/output line pGIOB and the complementary global input/output line GIOB may be electrically disconnected or separated from each other.

Figure 14A:
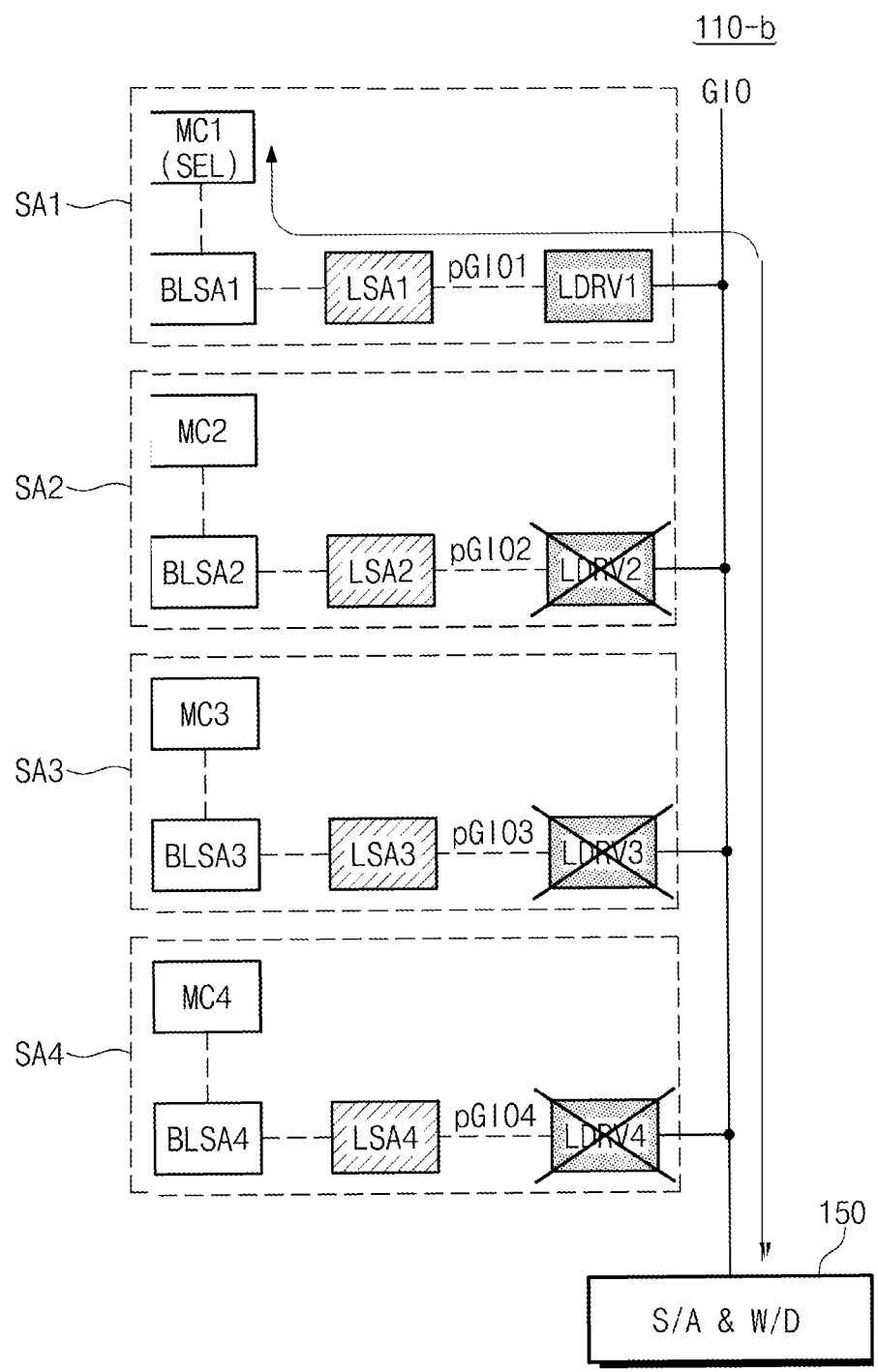
FIGS. 14A and 14B are diagrams for describing an operation of a memory device of FIG. 1.
Figure 14B:
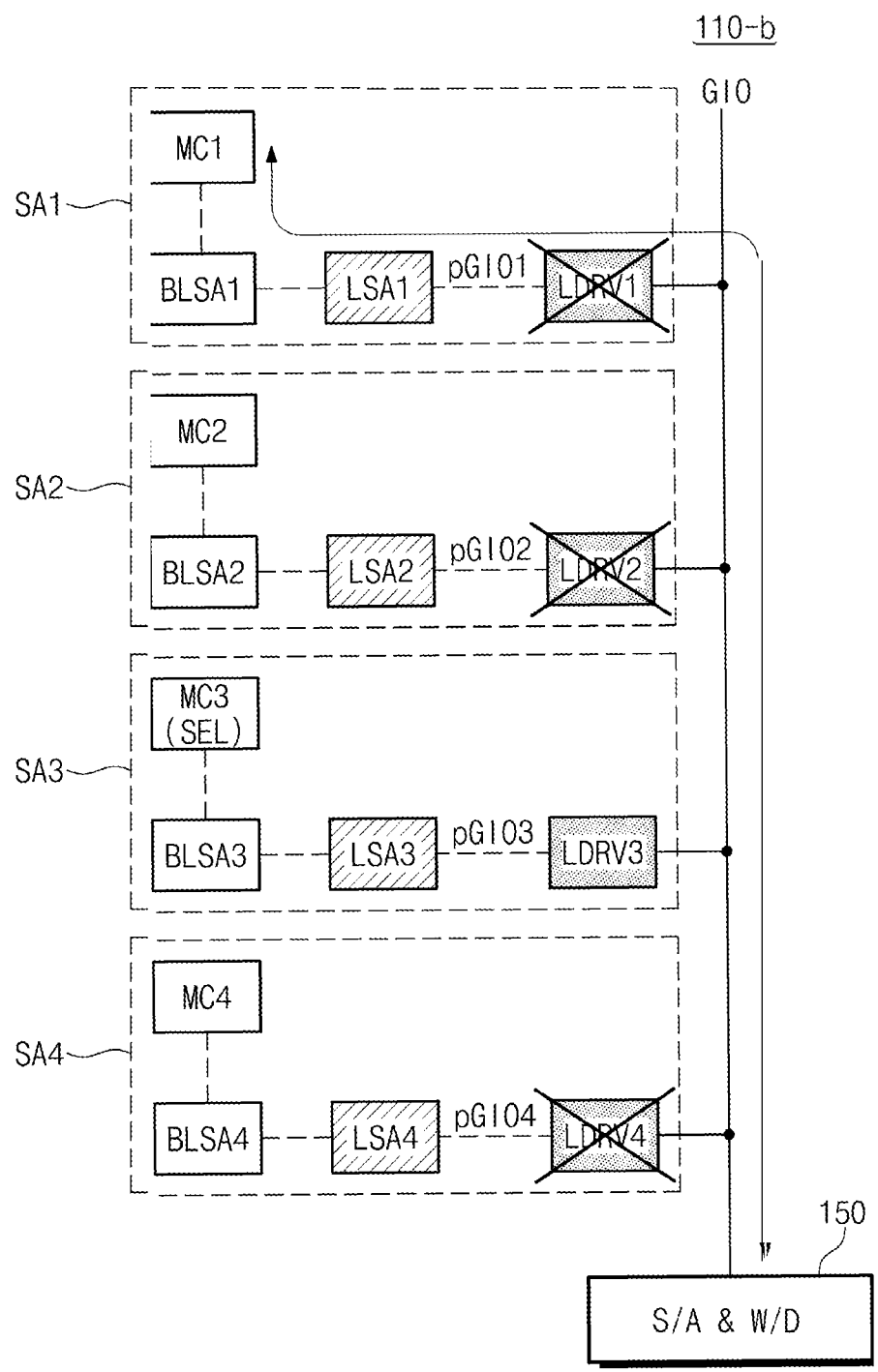

FIGS. 14A and 14B are diagrams for describing an operation of a memory device of FIG. 1. For convenience of description, components which are unnecessary to describe some embodiments of the present disclosure will be omitted.

Referring to FIGS. 1, 14A, and 14B, the memory cell array 110 may include a plurality of sub-arrays SA1 to SA4. The first sub-array SA1 may include the first memory cell MC1, the first bit line sense amplifier circuit BLSA1, the first local sense amplifier circuit LSA1, and the first local driver LDRV1. The second sub-array SA2 may include the second memory cell MC2, the second bit line sense amplifier circuit BLSA2, the second local sense amplifier circuit LSA2, and the second local driver LDRV2. The third sub-array SA3 may include a third memory cell MC3, a third bit line sense amplifier circuit BLSA3, a third local sense amplifier circuit LSA3, and a third local driver LDRV3. The fourth sub-array SA4 may include a fourth memory cell MC4, a fourth bit line sense amplifier circuit BLSA4, a fourth local sense amplifier circuit LSA4, and a fourth local driver LDRV4. Components of the plurality of sub-arrays SA1 to SA4 are similar to those described above, and thus, additional description will be omitted to avoid redundancy.

In some embodiments, the plurality of sub-arrays SA1 to SA4 may be connected with the sense amplifier and write driver 150 through the same global input/output line GIO.

In some embodiments, depending on operations of the memory device 100, the local drivers LDRV1 to LDRV4 included in the plurality of sub-arrays SA1 to SA4 may operate as a driver or a switch.

For example, as illustrated in FIG. 14A, it is assumed that an operation (e.g., a write operation or a read operation) is performed on the first memory cell MC1 included in the first sub-array SAL In this case, depending on the operation for the first memory cell MC1, the first local driver LDRV1 may electrically connect the global input/output lines GIO and a first pre-global input/output line pGIO1 or may control or drive the global input/output line GIO based on the level of the first pre-global input/output line pGIO1. In some embodiments, while the first local driver LDRV1 operates, all the second, third, and fourth local drivers LDRV2, LDRV3, and LDRV4 may be turned off, and thus, the global input/output line GIO may not be electrically connected with pre-global input/output lines pGIO pGIO2, pGIO3, and pGIO4 of the second to fourth sub-arrays SA2 to SA4.

In some embodiments, as illustrated in FIG. 14B, it is assumed that an operation (e.g., a write operation or a read operation) is performed on the third memory cell MC3 included in the third sub-array SA3. In this case, depending on the operation for the third memory cell MC3, the third local driver LDRV3 may electrically connect the global input/output lines GIO and the third pre-global input/output line pGIO3 or may control or drive the global input/output line GIO based on the level of the third pre-global input/output line pGIO3. In some embodiments, while the third local driver LDRV3 operates, all the first, second, and fourth local drivers LDRV1, LDRV2, and LDRV4 may be turned off, and thus, the global input/output line GIO may not be electrically connected with the pre-global input/output lines pGIO1, pGIO2, and pGIO4 of the first, second, and fourth sub-arrays SA1, SA2, and SA4.

As described above, the memory device 100 according to the present disclosure may include the local driver LDRV. When memory cells corresponding to the local driver LDRV do not operate, the local driver LDRV may be turned off, and thus, the RC loading of the global input/output line GIO may decrease. Accordingly, the performance and reliability of the memory device 100 may be improved.

Figure 15:
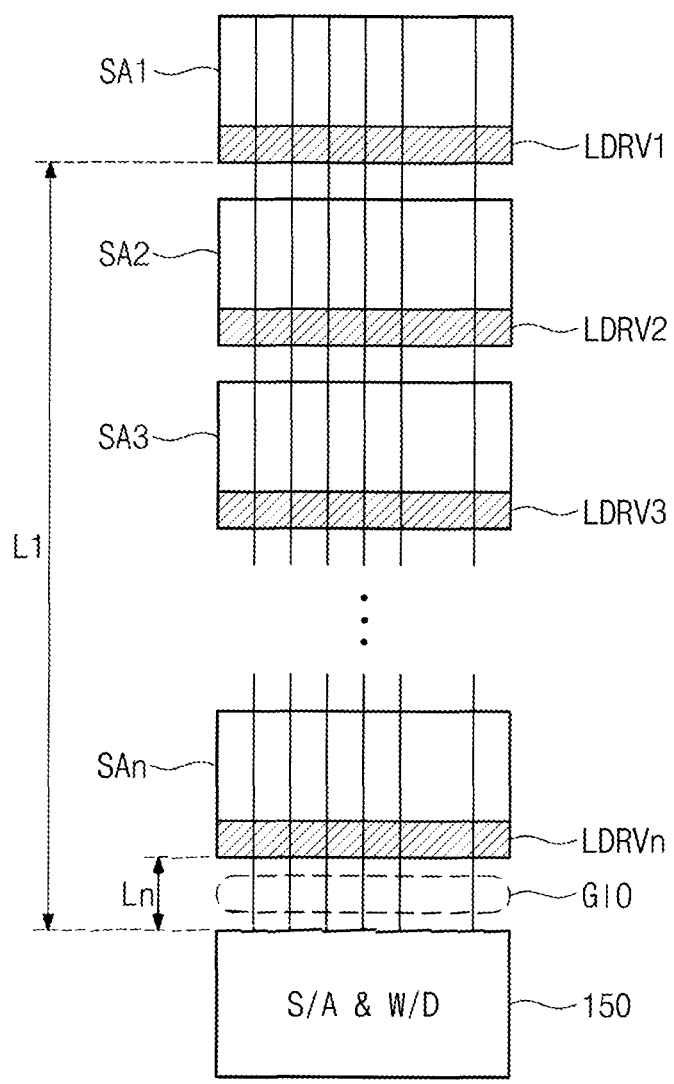
FIG. 15 is a diagram illustrating a memory device of FIG. 1.

FIG. 15 is a diagram illustrating a memory device of FIG. 1. For brevity of drawing, components which are unnecessary to describe some embodiments of the present disclosure will be omitted.

Referring to FIG. 15, a memory cell array 110-*c* may include a plurality of sub-arrays SA1 to SAn. The plurality of sub-arrays SA1 to SAn may include local drivers LDRV1 to LDRVn, respectively. The plurality of sub-arrays SA1 to SAn may be connected with the global input/output lines GIO through the local drivers LDRV1 to LDRVn. The global input/output lines GIO may be connected with the sense amplifier and write driver 150.

In some embodiments, the size, strength, or driving capability of a driving transistor included in a local driver may vary depending on a location of a sub-array or a location of the local driver. The size of the driving transistor may be based on the dimensions of various elements. For example, a length L1 of the global input/output line GIO between the first sub-array SA1 and the sense amplifier and write driver 150 may be longer than an n-th length Ln of the global input/output line GIO between the n-th sub-array SAn and the sense amplifier and write driver 150. In this case, the size, strength, or driving capability of a driving transistor included in the first local driver LDRV1 of the first sub-array SA1 may be greater than the size, strength, or driving capability of a driving transistor included in the n-th local driver LDRVn of the n-th sub-array SAn. That is, as a location of a sub-array or a local driver becomes more distant from the sense amplifier and write driver 150, the size, strength, or driving capability of the driving transistor included in the local driver may become greater.

Figure 16:
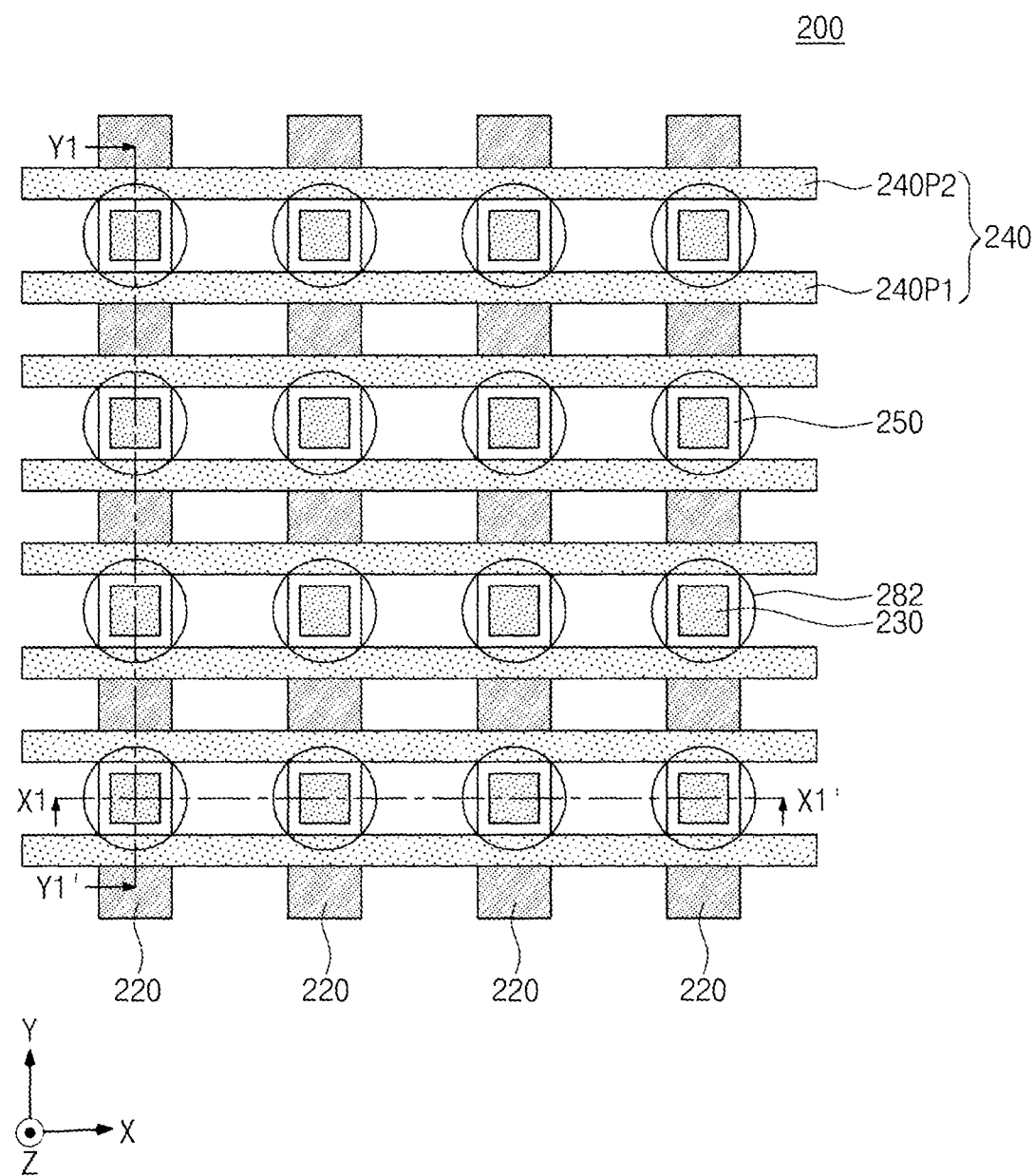
FIG. 16 is a layout illustrating an integrated circuit device according to some embodiments of the present disclosure.
Figure 17:
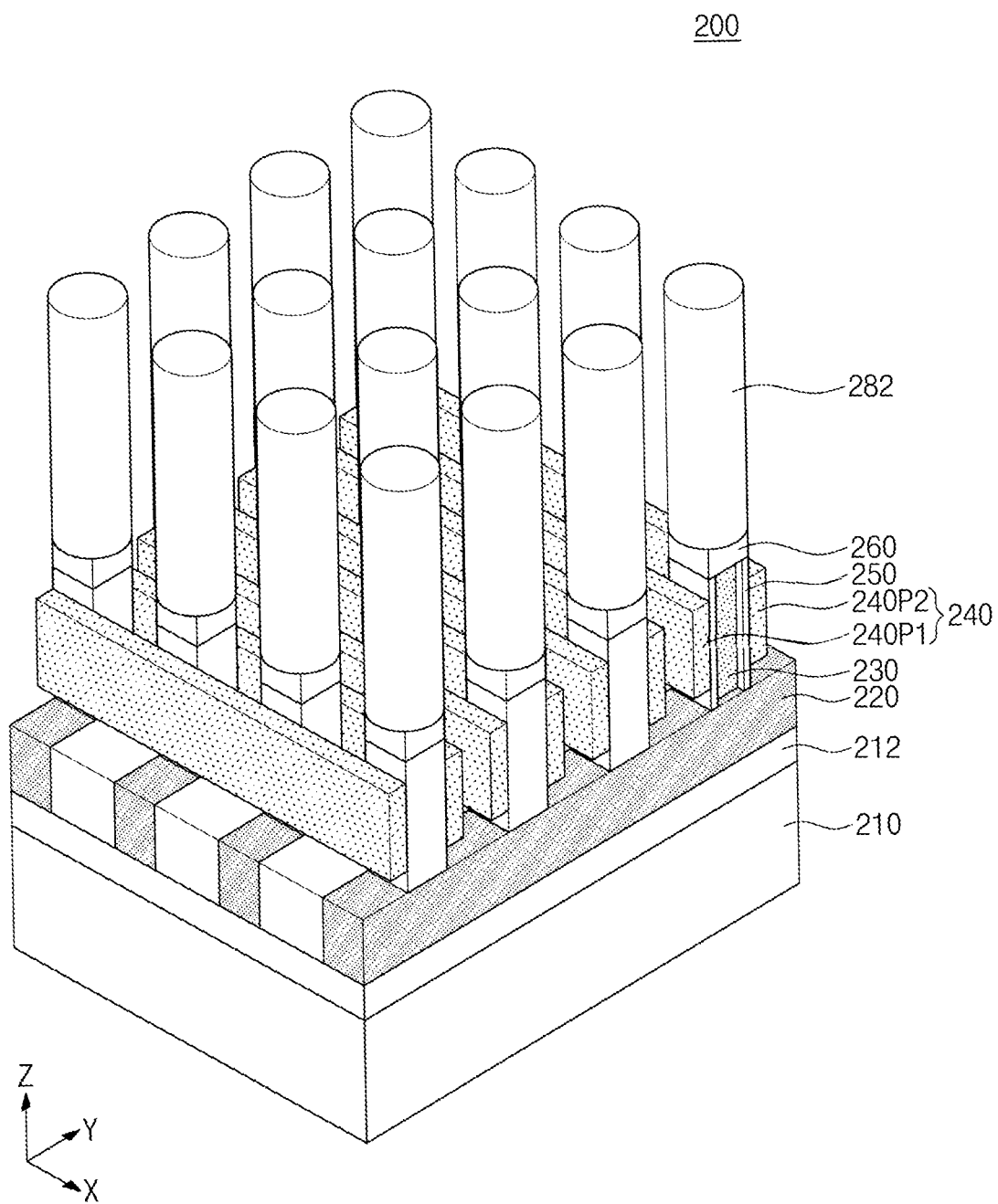
FIG. 17 is a perspective view illustrating an integrated circuit device.
Figure 18:
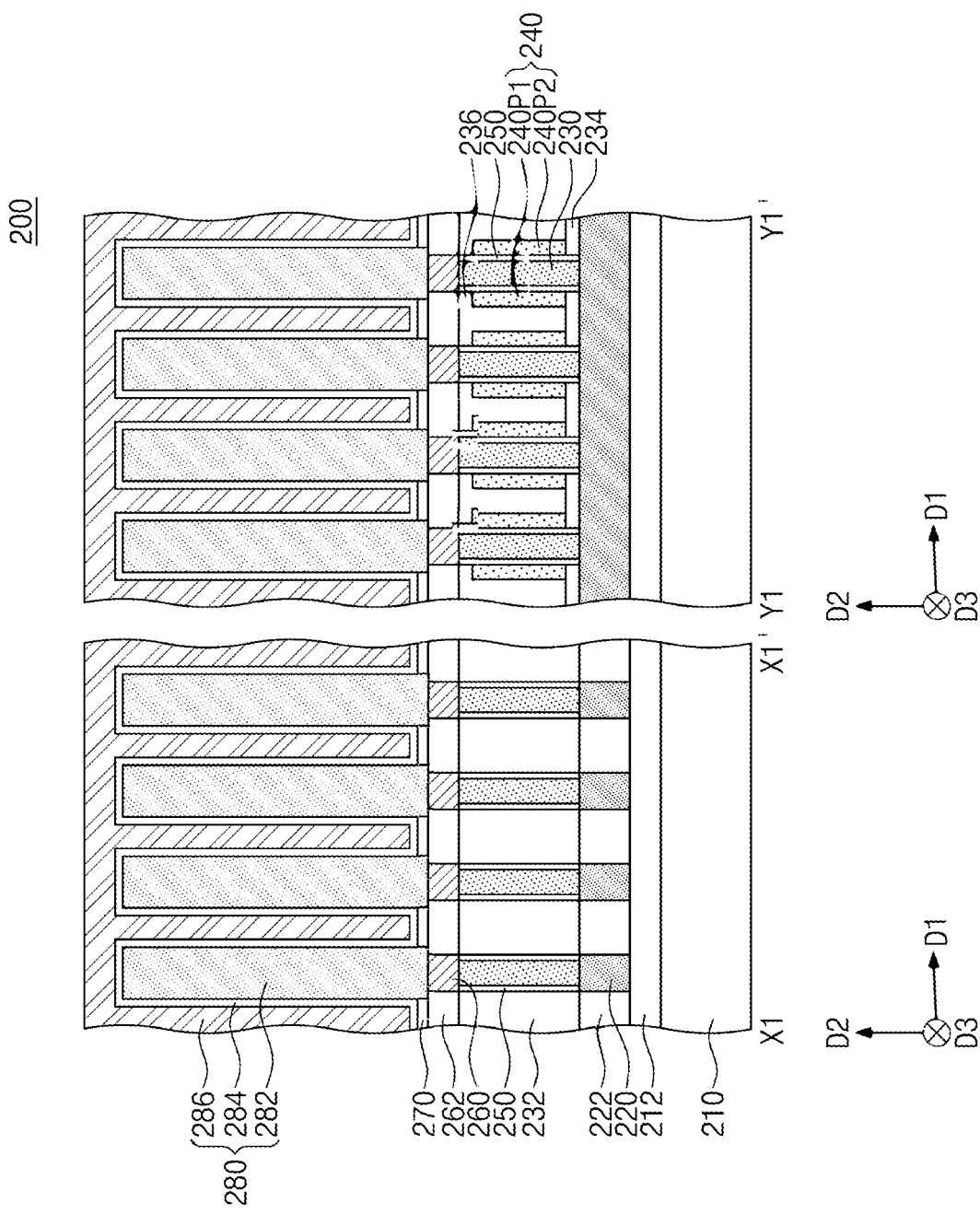
FIG. 18 is a cross-sectional view of an integrated circuit device taken along line X1-X1' and line Y1-Y1' of FIG. 16.

FIG. 16 is a layout illustrating an integrated circuit device 200 according to some embodiments of the present disclosure, FIG. 17 is a perspective view illustrating the integrated circuit device 200, and FIG. 18 is a cross-sectional view of the integrated circuit device 200 taken along line X1-X1' and line Y1-Y1' of FIG. 16.

In some embodiments, the integrated circuit device 200/200A to be described with reference to FIGS. 16 to 20 may be the memory device 100 described with reference to FIGS. 1 to 15 or may constitute some components of the memory device 100. In some embodiments, a memory device or a memory cell including a vertical channel transistor (VCT) to be described with reference to FIGS. 16 to 20 may be applied to the memory device 100 with the stacked structure (or the CoP structure) described with reference to FIGS. 1 to 15.

Referring to FIGS. 16 to 18, the integrated circuit device 200 may include a substrate 210, a plurality of first conductive lines 220, a channel layer 230, a gate electrode 240, a gate insulating layer 250, and a capacitor structure 280. The integrated circuit device 200 may be a memory device including the vertical channel transistor. The vertical channel transistor may have a structure in which a channel length of the channel layer 230 extends along a vertical direction from the substrate 210.

A lower insulating layer 212 may be disposed on the substrate 210, and the plurality of first conductive lines 220 may be disposed on the lower insulating layer 212 to be spaced from each other in a first direction (i.e., an X-direction) and extend in a second direction (i.e., a Y-direction). A plurality of first insulating patterns 222 may be disposed on the lower insulating layer 212 to fill or be in spaces between the plurality of first conductive lines 220. The plurality of first insulating patterns 222 may extend in the second direction (i.e., Y-direction), and upper surfaces of the plurality of first insulating patterns 222 may be disposed at the same level as upper surfaces of the plurality of first conductive lines 220. The plurality of first conductive lines 220 may function as bit lines of the integrated circuit device 200.

In some embodiments, the plurality of first conductive lines 220 may include doped polysilicon, metal, conductive metal nitride, conductive metal silicide, conductive metal oxide, or a combination thereof. For example, the plurality of first conductive lines 220 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto. The plurality of first conductive lines 220 may include a single layer or multiple layers formed of the materials described above. In some embodiments, the plurality of first conductive lines 220 may include a two-dimensional semiconductor material, and, for example, the two-dimensional semiconductor material may include graphene, carbon nanotube, or a combination thereof.

The channel layers 230 may be arranged on the plurality of first conductive lines 220 in a matrix form so as to be spaced from each other in the first direction (i.e., X-direction) and the second direction (i.e., Y-direction). The channel layer 230 may have a first width in the first direction (i.e., X-direction), may have a first height in a third direction (i.e., Z-direction), and the first height may be greater than the first width. For example, the first height may be about 2 to 10 times the first width, but is not limited thereto. A bottom portion of the channel layer 230 may function as a first source/drain region (not illustrated), an upper portion of the channel layer 230 may function as a second source/drain region (not illustrated), and a portion of the channel layer 230 between the first and second source/drain regions may function as a channel region (not illustrated).

In some embodiments, the channel layer 230 may include an oxide semiconductor. For example, the oxide semiconductor may include InxGayZnzO, InxGaySizO, InxSnyZnzO, InxZnyO, ZnxO, ZnxSnyO, ZnxOyN, ZrxZ-nySnzO, SnxO, HfxInyZOnzO, AlxGaySnz, or InxGay-SnzO, GaxGaySnz, or a combination thereof. The channel layer 230 may include a single layer or multiple layers formed of the oxide semiconductor. In some embodiments, the channel layer 230 may have bandgap energy greater than bandgap energy of silicon. For example, the channel layer 230 may have the bandgap energy of about 1.5 eV to 5.6 eV. For example, when the channel layer 230 has the bandgap energy of about 2.0 eV to 4.0 eV, the channel layer 230 may have optimum channel performance. For example, the channel layer 230 may be polycrystalline or amorphous, but is not limited thereto. In some embodiments, the channel layer 230 may include a two-dimensional semiconductor material, and, for example, the two-dimensional semiconductor material may include graphene, carbon nanotube, or a combination thereof.

The gate electrode 240 may extend in the first direction (i.e., X-direction) on opposite side walls of the channel layer 230. The gate electrode 240 may include a first sub-gate electrode 240P1 facing a first side wall of the channel layer 230, and a second sub-gate electrode 240P2 facing a second side wall of the channel layer 230, which is opposite to the first side wall. As one channel layer 230 is interposed between the first sub-gate electrode 240P1 and the second sub-gate electrode 240P2, the integrated circuit device 200 may have a dual-gate transistor structure. However, the present disclosure is not limited thereto. For example, a single-gate transistor structure may be implemented by omitting the second sub-gate electrode 240P2 and forming only the first sub-gate electrode 240P1 facing the first side wall of the channel layer 230.

The gate electrode 240 may include doped polysilicon, metal, conductive metal nitride, conductive metal silicide, conductive metal oxide, or a combination thereof. For example, the gate electrode 240 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto.

The gate insulating layer 250 may surround the side wall of the channel layer 230 and may be interposed between the channel layer 230 and the gate insulating layer 250. For example, as illustrated in FIG. 16, the whole side wall of the channel layer 230 may be surrounded by the gate insulating layer 250, and a portion of the side wall of the gate electrode 240 may be in contact with the gate insulating layer 250. In other embodiments, the gate insulating layer 250 may extend in an extending direction of the gate electrode 240 (i.e., the first direction (i.e., X-direction)), and two side walls facing the gate electrode 240 from among side walls of the channel layer 230 may be in contact with the gate insulating layer 250.

In some embodiments, the gate insulating layer 250 may be formed of a silicon oxide layer, a silicon oxynitride layer, a high dielectric layer whose dielectric constant is higher than that of the silicon oxide layer, or a combination thereof. The high dielectric layer may be formed of metal oxide or metal oxynitride. For example, the high dielectric layer that is available as the gate insulating layer 250 may be formed of HfO2, HfSiO, HfSiON, HfTaO, HfSiO, HfZrO, ZrO2, Al2O3, or a combination thereof, but is not limited thereto.

A plurality of second insulating patterns 232 may extend along the second direction (i.e., Y-direction) on the plurality of first insulating patterns 222, and the channel layer 230 may be disposed between two second insulating patterns 232 adjacent to each other from among the plurality of second insulating patterns 232. Also, between the two second insulating patterns 232 adjacent to each other, a first buried layer 234 and a second buried layer 236 may be disposed in a space between two adjacent channel layers 230. The first buried layer 234 may be disposed at a bottom portion of the space between the two adjacent channel layers 230, and the second buried layer 236 may be formed on the first buried layer 234 to fill the remaining space between the two adjacent channel layers 230. An upper surface of the second buried layer 236 may be disposed at the same level as an upper surface of the channel layer 230, and the second buried layer 236 may cover or overlap an upper surface of the gate electrode 240. Unlike the above description, the plurality of second insulating patterns 232 may be formed of a material layer continuous to the plurality of first insulating patterns 222, or the second buried layer 236 may be formed of a material layer continuous to the first buried layer 234.

A capacitor contact 260 may be disposed on the channel layer 230. The capacitor contacts 260 may be disposed to vertically overlap the channel layers 230, and may be arranged in a matrix form so as to be spaced from each other in the first direction (i.e., X-direction) and the second direction (i.e., Y-direction). The capacitor contact 260 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto. An upper insulating layer 262 may surround side walls in plan view of the capacitor contacts 260 on the plurality of second insulating patterns 232 and the second buried layer 236.

An etch-stop layer 270 may be disposed on the upper insulating layer 262, and the capacitor structure 280 may be disposed on the etch-stop layer 270. The capacitor structure 280 may include a lower electrode 282, a capacitor dielectric layer 284, and an upper electrode 286.

The lower electrode 282 may be electrically connected with an upper surface of the capacitor contact 260 through the etch-stop layer 270. The lower electrode 282 may be formed in the shape of a pillar extending in the third direction (i.e., Z-direction), but is not limited thereto. In some embodiments, the lower electrodes 282 may be disposed to vertically overlap the capacitor contacts 260, and may be arranged in a matrix form so as to be spaced from each other in the first direction (i.e., X-direction) and the second direction (i.e., Y-direction). Unlike the above description, a landing pad (not illustrated) may be further disposed between the capacitor contact 260 and the lower electrode 282 such that the lower electrodes 282 are arranged in a hexagonal shape.

Figure 19:
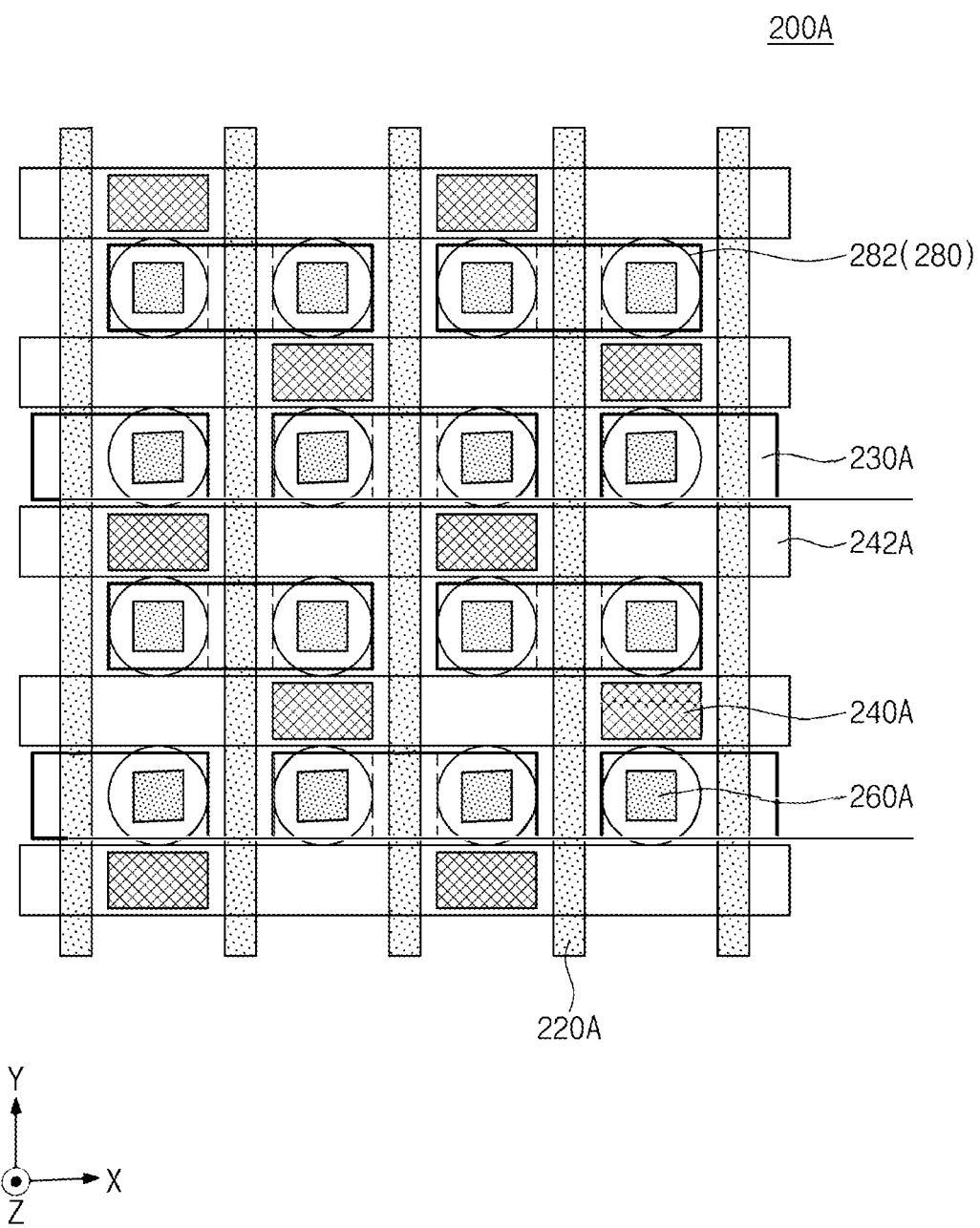
FIG. 19 is a layout illustrating an integrated circuit device according to some embodiments.
Figure 20:
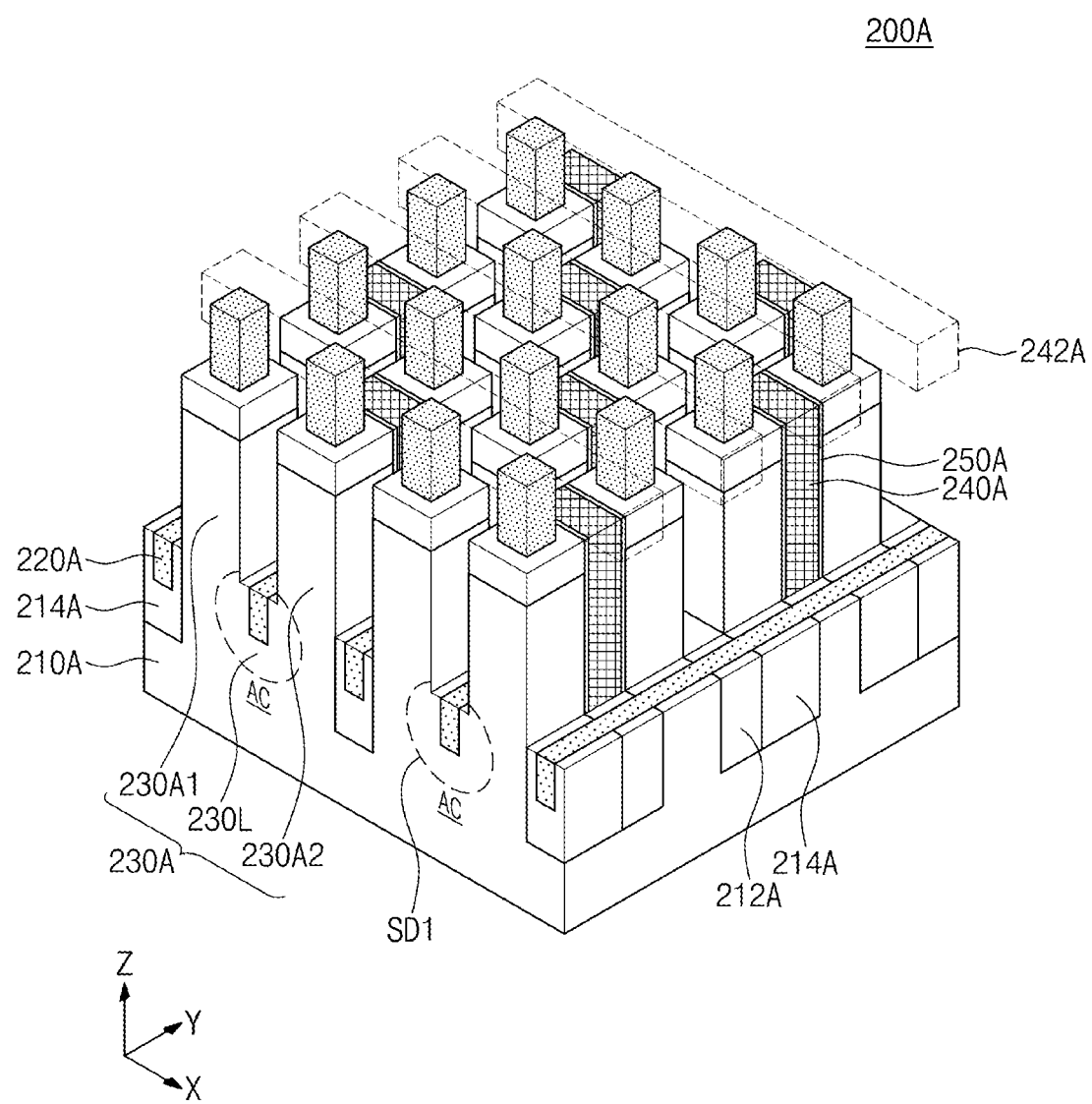
FIG. 20 is a perspective view illustrating an integrated circuit device.

FIG. 19 is a layout illustrating an integrated circuit device 200A according to some embodiments, and FIG. 20 is a perspective view illustrating the integrated circuit device 200A.

Referring to FIGS. 19 and 20, the integrated circuit device 200A may include a substrate 210A, a plurality of first conductive lines 220A, a channel structure 230A, a contact gate electrode 240A, a plurality of second conductive lines 242A, and the capacitor structure 280. The integrated circuit device 200A may be a memory device including a vertical channel transistor (VCT).

A plurality of active regions AC may be defined in the substrate 210A by a first device isolation layer 212A and a second device isolation layer 214A. The channel structure 230A may be disposed in each active region AC, and the channel structure 230A may include a first active pillar 230A1 and a second active pillar 230A2 extending in a vertical direction, and a connecting part 230L connected with a bottom portion of the first active pillar 230A1 and a bottom portion of the second active pillar 230A2. A first source/drain region SD1 may be disposed in the connecting part 230L, and a second source/drain region SD2 may be disposed on an upper side of the first and second active pillar 230A1 and 230A2. Each of the first active pillar 230A1 and the second active pillar 230A2 may constitute or be part of an independent unit memory cell.

The plurality of first conductive lines 220A may extend in a direction intersecting each of the plurality of active regions AC. For example, the plurality of first conductive lines 220A may extend in the second direction (i.e., Y-direction). One first conductive line 220A of the plurality of first conductive lines 220A may be disposed on the connecting part 230L between the first active pillar 230A1 and the second active pillar 230A2, and the one first conductive line 220A may be disposed on the first source/drain region SD1. Another first conductive line 220A adjacent to the one first conductive line 220A may be disposed between two channel structures 230A. One first conductive line 220A of the plurality of first conductive lines 220A may function as a common bit line associated with 2 unit memory cells that the first active pillar 230A1 and the second active pillar 230A2 disposed on opposite sides of the one first conductive line 220A constitute.

One contact gate electrode 240A may be disposed between two channel structures 230A adjacent in the second direction (i.e., Y-direction). For example, the contact gate electrode 240A may be disposed between the first active pillar 230A1 included in one channel structure 230A and the second active pillar 230A2 of the channel structure 230A adjacent to the one channel structure 230A, and may be shared by the first active pillar 230A1 and the second active pillar 230A2 disposed on opposite side walls thereof. A gate insulating layer 250A may be disposed between the contact gate electrode 240A and the first active pillar 230A1 and between the contact gate electrode 240A and the second active pillar 230A2. The plurality of second conductive lines 242A may extend in the first direction (i.e., X-direction) on the contact gate electrode 240A. The plurality of second conductive lines 242A may function as word lines of the integrated circuit device 200A.

A capacitor contact 260A may be disposed on the channel structure 230A. The capacitor contact 260A may be disposed on the second source/drain region SD2, and the capacitor structure 280 may be disposed on the capacitor contact 260A.

Figure 21:
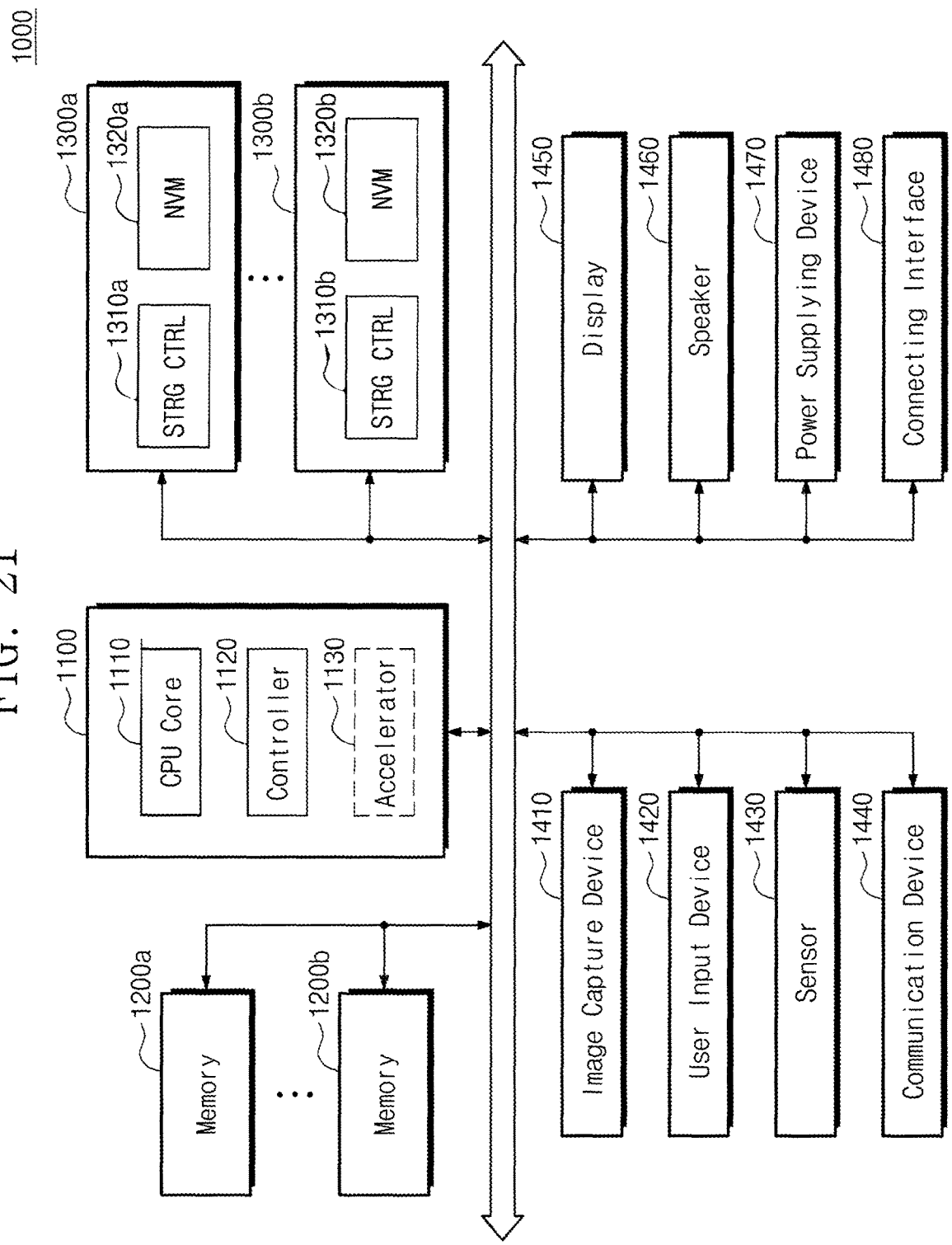
FIG. 21 is a diagram illustrating a system to which a memory device according to some embodiments of the present disclosure is applied.

FIG. 21 is a diagram of a system 1000 to which a storage device is applied, according to some embodiments. The system 1000 of FIG. 21 may basically be a mobile system, such as a portable communication terminal (e.g., a mobile phone), a smartphone, a tablet personal computer (PC), a wearable device, a healthcare device, or an Internet of things (JOT) device. However, the system 1000 of FIG. 21 is not necessarily limited to the mobile system and may be a PC, a laptop computer, a server, a media player, or an automotive device (e.g., a navigation device).

Referring to FIG. 21, the system 1000 may include a main processor 1100, memories (e.g., 1200*a* and 1200*b*), and storage devices (e.g., 1300*a* and 1300*b*). In addition, the system 1000 may include at least one of an image capture device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200*a* and 1200*b* and/or the storage devices 1300*a* and 1300*b*. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200*a* and 1200*b* may be used as main memory devices of the system 1000. Although each of the memories 1200*a* and 1200*b* may include a volatile memory, such as static random access memory (SRAM) and/or dynamic RAM (DRAM), each of the memories 1200*a* and 1200*b* may include non-volatile memory, such as a flash memory, phase-change RAM (PRAM) and/or resistive RAM (RRAM). The memories 1200*a* and 1200*b* may be implemented in the same package as the main processor 1100.

The storage devices 1300*a* and 1300*b* may serve as non-volatile storage devices configured to store data regardless of whether power is supplied thereto, and have larger storage capacity than the memories 1200*a* and 1200*b*. The storage devices 1300*a* and 1300*b* may respectively include storage controllers (STRG CTRL) 1310*a* and 1310*b* and NVM (Non-Volatile Memory)s 1320*a* and 1320*b* configured to store data via the control of the storage controllers 1310*a* and 1310*b*. Although the NVMs 1320*a* and 1320*b* may include flash memories having a two-dimensional (2D) structure or a three-dimensional (3D) V-NAND structure, the NVMs 1320*a* and 1320*b* may include other types of NVMs, such as PRAM and/or RRAM.

The storage devices 1300*a* and 1300*b* may be physically separated from the main processor 1100 and included in the system 1000 or implemented in the same package as the main processor 1100. In addition, the storage devices 1300*a* and 1300*b* may have types of solid-state devices (SSDs) or memory cards and be removably combined with other components of the system 1000 through an interface, such as the connecting interface 1480 that will be described below. The storage devices 1300*a* and 1300*b* may be devices to which a standard protocol, such as a universal flash storage (UFS), an embedded multi-media card (eMMC), or a non-volatile memory express (NVMe), is applied, without being limited thereto.

The image capture device 1410 may capture still images or moving images. The image capture device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and/or auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In some embodiments, various memory devices (e.g., 1200a and 1200b) included in the system 1000 may be the memory devices described with reference to FIGS. 1 to 20.

According to the present disclosure, a memory device with improved reliability and improved performance is provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
   a first memory cell electrically connected with a first word line and a first bit line;
   a first bit line sense amplifier circuit electrically connected with the first bit line;
   a first local sense amplifier circuit electrically connected with the first bit line sense amplifier circuit through a first local input/output line;
   a first local driver electrically connected with the first local sense amplifier circuit through a first pre-global input/output line; and
   a sense amplifier and write driver electrically connected with the first local driver through a global input/output line,
   wherein the first local driver is configured to selectively electrically disconnect the first pre-global input/output line from the global input/output line, based on an operation for the first memory cell.

2. The memory device of claim 1, wherein the first bit line sense amplifier circuit, the first local sense amplifier circuit, and the first local driver are included in a transistor layer that is on a substrate,
   wherein the first local input/output line and the first pre-global input/output line are included in a wiring layer that is on the transistor layer,
   wherein the first memory cell is included in a memory cell layer that is on the wiring layer, and
   wherein the global input/output line is included in a metal layer that is on the memory cell layer.

3. The memory device of claim 2, wherein the first local driver is electrically connected with the global input/output line through a contact plug that vertically penetrates the memory cell layer.

4. The memory device of claim 1, wherein the first local driver is configured to:
   electrically connect the global input/output line and the first pre-global input/output line, in a write operation for the first memory cell; and
   drive the global input/output line based on a voltage of the first pre-global input/output line, in a read operation for the first memory cell.

5. The memory device of claim 4, wherein the first local driver is further configured to:
   when the write operation or the read operation for the first memory cell is not performed, electrically disconnect the first pre-global input/output line from the global input/output line.

6. The memory device of claim 1, wherein the first local driver comprises:
   a first transmission gate electrically connected between the global input/output line and the first pre-global input/output line, wherein the first transmission gate is configured to operate in response to a MUX signal;
   a first driving transistor electrically connected between the global input/output line and a ground voltage;
   a second transmission gate connected between a gate of the first driving transistor and the first pre-global input/output line, wherein the second transmission gate is configured to operate in response to a first driving-off signal; and
   a first pull-down transistor electrically connected between the gate of the first driving transistor and the ground voltage, wherein the first pull-down transistor is configured to operate in response to a second driving-off signal that is logically complementary to the first driving-off signal.

7. The memory device of claim 6, wherein the first local sense amplifier circuit comprises:
   a first PMOS transistor electrically connected between a first node and a first complementary local input/output line;
   a second PMOS transistor electrically connected between the first node and the first local input/output line;
   a third PMOS transistor electrically connected between the first node and a power supply voltage;
   a first NMOS transistor electrically connected between the first pre-global input/output line and a second node;
   a second NMOS transistor electrically connected between the first local input/output line and a third node;
   a third NMOS transistor electrically connected between the second node and the ground voltage;
   a fourth NMOS transistor electrically connected between the third node and the ground voltage; and
   a fifth NMOS transistor electrically connected between the first complementary local input/output line and the first pre-global input/output line,
   wherein a gate of the first PMOS transistor is electrically connected with the first local input/output line,
   wherein a gate of the second PMOS transistor is electrically connected with the first complementary local input/output line,
   wherein a gate of the third PMOS transistor is electrically connected with a first activation signal,
   wherein a gate of the first NMOS transistor is electrically connected with the first local input/output line,
   wherein a gate of the second NMOS transistor is connected with the first pre-global input/output line,
   wherein a gate of the third NMOS transistor is electrically connected with a second activation signal,
   wherein a gate of the fourth NMOS transistor is electrically connected with a third activation signal, and
   wherein a gate of the fifth NMOS transistor is electrically connected with the MUX signal.

8. The memory device of claim 1, further comprising:
   a first sub-word line driver configured to control the first word line.

9. The memory device of claim 1, further comprising:
   a second memory cell electrically connected with a second word line and a second bit line;
   a second bit line sense amplifier circuit electrically connected with the second bit line;
   a second local sense amplifier circuit electrically connected with the second bit line sense amplifier circuit through a second local input/output line; and
   a second local driver electrically connected with a second pre-global input/output line and electrically connected with the global input/output line.

10. The memory device of claim 9, wherein the second local driver is configured to selectively electrically disconnect the second pre-global input/output line from the global input/output line, based on an operation for the second memory cell.

11. The memory device of claim 1, wherein the first memory cell is a dynamic random access memory (DRAM) cell.

12. The memory device of claim 1, further comprising:
an input/output circuit configured to transfer data received from an external device to the sense amplifier and write driver or to transfer data received from the sense amplifier and write driver to the external device;
a command address buffer configured to receive a command/address signal from the external device;
an address decoder configured to receive an address signal from the command address buffer and to control the first word line based on the address signal; and
a command decoder configured to receive a command signal from the command address buffer and to control the sense amplifier and write driver and the input/output circuit based on the command signal.

13. A memory device comprising:
a first sub-array including a first local driver electrically connected with a global input/output line; and
a second sub-array including a second local driver electrically connected with the global input/output line,
wherein, when an operation for a first memory cell included in the first sub-array is performed, the second local driver is configured to electrically isolate from the global input/output line, and
wherein, when an operation for a second memory cell included in the second sub-array is performed, the first local driver is configured to electrically isolate from the global input/output line,
wherein the first local driver comprises:
a first transmission gate electrically connected between a first pre-global input/output line and the global input/output line;
a first driving transistor electrically connected between the global input/output line and a ground voltage;
a second transmission gate electrically connected between a gate of the first driving transistor and the first pre-global input/output line; and
a first pull-down transistor electrically connected between the gate of the first driving transistor and the ground voltage, and
wherein the second local driver comprises:
a third transmission gate electrically connected between a second pre-global input/output line and the global input/output line;
a second driving transistor electrically connected between the global input/output line and the ground voltage;
a fourth transmission gate electrically connected between a gate of the second driving transistor and the second pre-global input/output line; and
a second pull-down transistor electrically connected between the gate of the second driving transistor and the ground voltage.

14. The memory device of claim 13, wherein the first sub-array further comprises:
a first bit line sense amplifier circuit electrically connected with the first memory cell through a first bit line; and
a first local sense amplifier circuit electrically connected with the first bit line sense amplifier circuit through a first local input/output line,
wherein the second sub-array further comprises:

a second bit line sense amplifier circuit electrically connected with the second memory cell through a second bit line; and
a second local sense amplifier circuit electrically connected with the second bit line sense amplifier circuit through a second local input/output line.

15. The memory device of claim 14, wherein the first local driver is electrically connected with the first local sense amplifier circuit through the first pre-global input/output line, and
wherein the second local driver is connected with the second local sense amplifier circuit through the second pre-global input/output line.

16. The memory device of claim 15,
wherein the first transmission gate is configured to operate in response to a first MUX signal,
wherein the second transmission gate is configured to operate in response to a first driving-off signal,
wherein the first pull-down transistor is configured to operate in response to the first driving-off signal, and
wherein the third transmission gate is configured to operate a second MUX signal,
wherein the fourth transmission gate is configured to operate in response to a second driving-off signal being; and
wherein the second pull-down transistor is configured to operate in response to the second driving-off signal.

17. The memory device of claim 16, wherein a size of the first driving transistor is different from a size of the second driving transistor.

18. The memory device of claim 15, wherein the first and second bit line sense amplifier circuits, the first and second local sense amplifier circuits, and the first and second local drivers are included in a transistor layer that is on a substrate,
wherein the first and second local input/output lines and the first and second pre-global input/output line are included in a wiring layer that is on the transistor layer,
wherein the first and second memory cells are included in a memory cell layer that is on the wiring layer, and
wherein the global input/output line is included in a metal layer that is on the memory cell layer.

19. A memory device comprising:
a substrate;
a transistor layer on the substrate and including a first bit line sense amplifier circuit, a first local sense amplifier circuit, and a first local driver;
a wiring layer on the transistor layer and including a first local input/output line that electrically connects the first bit line sense amplifier circuit and the first local sense amplifier circuit, and a first pre-global input/output line that electrically connects the first local sense amplifier circuit and the first local driver;
a memory cell layer on the wiring layer and including a first memory cell that is electrically connected with the first bit line sense amplifier circuit through a first bit line; and
a metal layer on the memory cell layer and including a global input/output line that is electrically connected with the first local driver.

20. The memory device of claim 19, wherein the first local driver is configured to:
control the global input/output line based on the first pre-global input/output line, in a read operation for the first memory cell;
electrically connect the global input/output line and the first pre-global input/output line, in a write operation for the first memory cell; and when the read operation or the write operation for the first memory cell is not being performed, the global input/output line is electrically isolated from the first pre-global input/output line.

* * * * *